(12) United States Patent
Kommera et al.

(10) Patent No.: US 9,911,875 B2
(45) Date of Patent: Mar. 6, 2018

(54) SOLAR CELL METALLIZATION

(71) Applicant: Solexel, Inc., Milpitas, CA (US)

(72) Inventors: Swaroop Kommera, Milpitas, CA (US); Pawan Kapur, Milpitas, CA (US); Yen-Sheng Su, Milpitas, CA (US); Vivek Saraswat, Milpitas, CA (US); Anand Deshpande, Milpitas, CA (US); Mehrdad M. Moslehi, Los Altos, CA (US)

(73) Assignee: Beamreach-Solexel Assets LLC, Yardley, PA (US)

( * ) Notice: Subject to any disclaimer, the term of this patent is extended or adjusted under 35 U.S.C. 154(b) by 0 days.

(21) Appl. No.: 14/260,272

(22) Filed: Apr. 23, 2014

(65) Prior Publication Data

US 2015/0068592 A1   Mar. 12, 2015

Related U.S. Application Data

(60) Provisional application No. 61/815,106, filed on Apr. 23, 2013.

(51) Int. Cl.
| | |
|---|---|
| *H01L 31/0224* | (2006.01) |
| *H01L 31/068* | (2012.01) |
| *H01L 31/05* | (2014.01) |
| *H01L 31/02* | (2006.01) |

(52) U.S. Cl.
CPC .. *H01L 31/022441* (2013.01); *H01L 31/0516* (2013.01); *H01L 31/0682* (2013.01); *H01L 31/02008* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 2008/0048303 | A1* | 2/2008 | Amagai | H01L 23/3128 257/668 |
| 2008/0216887 | A1* | 9/2008 | Hacke | H01L 31/0516 136/244 |
| 2010/0012172 | A1* | 1/2010 | Meakin | H01L 31/048 136/251 |

(Continued)

FOREIGN PATENT DOCUMENTS

| | | | | |
|---|---|---|---|---|
| WO | WO-2012128284 A1 * | 9/2012 | | H01L 31/0201 |

*Primary Examiner* — Bethany L Martin
*Assistant Examiner* — William E McClain
(74) *Attorney, Agent, or Firm* — Howard IP Law Group, PC

(57) ABSTRACT

An interdigitated back contact solar cell is provided. The solar cell comprises a solar cell substrate having a light receiving frontside and a backside comprising base and emitter regions. A first level metal (M1) layer is positioned on the substrate backside contacting the base and emitter regions. A second level metal (M2) layer is connected to the first level metal (M1) layer and comprises a base busbar and an emitter busbar. The first level metal comprises substantially orthogonal interdigitated metallization and substantially parallel interdigitated metallization positioned under and corresponding to the base and emitter busbars on the second level metal (M2). The substantially parallel interdigitated metallization of M1 collects carriers of opposite polarity of the corresponding busbar.

7 Claims, 18 Drawing Sheets

(56) References Cited

U.S. PATENT DOCUMENTS

| | | | | |
|---|---|---|---|---|
| 2010/0154876 A1* | 6/2010 | Camalleri | ............. | H01L 31/182 |
| | | | | 136/255 |
| 2011/0041908 A1* | 2/2011 | Harder | .............. | H01L 31/03529 |
| | | | | 136/256 |
| 2011/0120530 A1* | 5/2011 | Isaka | ................. | B32B 17/10018 |
| | | | | 136/251 |
| 2012/0028399 A1* | 2/2012 | Moslehi | .................. | H01L 31/18 |
| | | | | 438/72 |
| 2012/0103408 A1* | 5/2012 | Moslehi | ............ | H01L 31/02244 |
| | | | | 136/256 |

\* cited by examiner

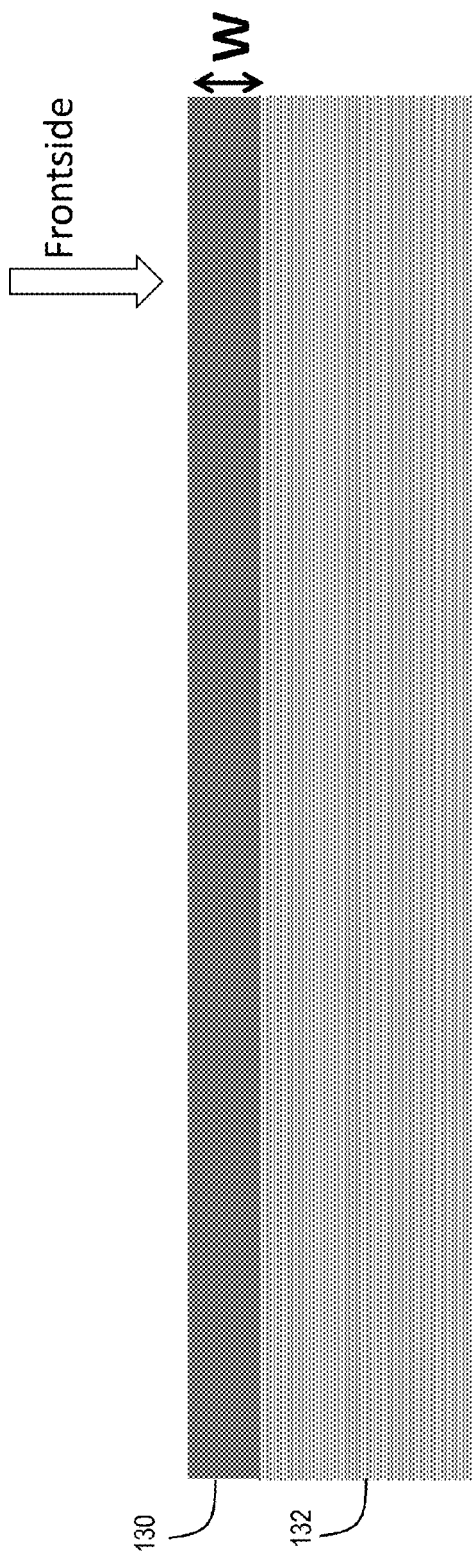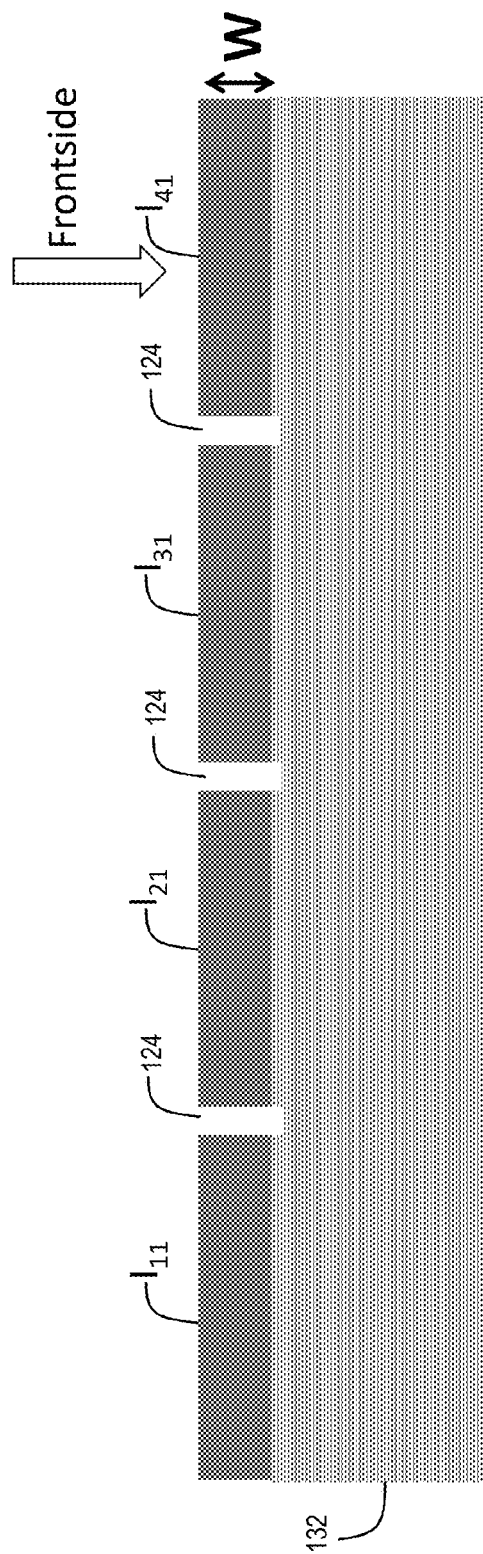

SOLAR CELL METALLIZATION

CROSS-REFERENCE TO RELATED APPLICATIONS

This application claims the benefit of U.S. provisional patent application 61/815,106 filed on Apr. 23, 2013, which is hereby incorporated by reference in its entirety.

FIELD OF THE INVENTION

The present disclosure relates in general to the fields of solar photovoltaic (PV) cells, and more particularly solar cell metallization.

BACKGROUND

As photovoltaic solar cell technology is adopted as an energy generation solution on an increasingly widespread scale, fabrication and efficiency improvements relating to solar cell efficiency and current/carrier collection and metallization are required. Efficient solar cell metallization requires base metallization contacting base regions of the solar cell and base busbar(s) collecting current from the base metallization as well as emitter metallization contacting emitter regions of the solar cell and emitter busbar(s) collecting current from the emitter metallization. These basic metallization structures are applicable to various types of front and back contact solar cells including front and back junction back contact solar cells.

With reference to interdigitated back contact (IBC) back junction solar cells, single level metallization structures provide on-cell base and emitter metallization in the form of interdigitated base and emitter metallization fingers as well as on-cell base and emitter busbars, often positioned around the peripheral edge of the solar cell. However, these busbars often result in increased lateral path distance for carrier collection and thus so-called electrical shading due to loss of minority carriers prior to collection by emitter junction—for example an on-cell base busbar does not allow contact to solar cell emitter regions over the cell surface area it occupies, thus forcing the minority carriers to travel laterally within the solar cell (e.g., in silicon) past the full extent of the base busbar surface area to a corresponding nearest emitter metallization finger (in the described case a minority carrier such as a hole (+) in n-type silicon under the base bar must travel within the absorber to an emitter finger). In other words, in prior art embodiments the base busbar does not allow contact to the cell emitter, forcing minority carriers to travel laterally past the full extent of the base busbar to be collected by the nearest emitter junction regions. In practice, and depending on current collection requirements and metallization materials in an IBC solar cell, base and emitter busbars are usually many times larger than corresponding IBC base and emitter fingers (in terms of lateral dimensions and areas). Thus, these known designs result in significant lateral path distance for carriers located under opposite polarity busbars and reduce the semiconductor area available for active current collection, resulting in solar cell efficiency loss due to electrical shading. The electrical shading induced loss of current from active semiconductor material poses a substantial challenge for improving solar cell efficiency.

Further, multi-level solar cell metallization structures often rely on conductive vias/posts/paths for electrical connection between metallization layers. In the case of an interdigitated back contact solar cell having a dual level metallization pattern with second level metallization base and emitter busbars (in other words off-cell busbars), the required conductive current paths from the on-cell base and emitter metallization to the second level metallization may impose current collection restrictions and constraints in the cell regions below the second level metallization busbars and result in the loss of carrier collection. For example, busbars (such as edge busbars positioned peripherally around the solar cell edge) may rely on conductive posts or conductive via plugs formed through an insulating layer for connection to the underlying on-cell metallization. When large area busbars are required, opposite polarity carrier collection of the cell area "covered" by the busbar may be partially or fully lost due to electrical shading associated with the solar cell busbars.

BRIEF SUMMARY OF THE INVENTION

Therefore, a need has arisen for an interdigitated back contact solar cell and metallization structures that provide increased solar cell current collection. In accordance with the disclosed subject matter, an interdigitated back contact solar cell is provided which substantially eliminates or reduces disadvantages and deficiencies associated with previously developed interdigitated back contact solar cells and metallization structures.

According to one aspect of the disclosed subject matter, an interdigitated back contact solar cell is provided. The solar cell comprises a solar cell substrate having a light receiving frontside and a backside comprising base and emitter regions. A first level metal (M1) layer is positioned on the substrate backside contacting the base and emitter regions. A second level metal (M2) layer is connected to the first level metal (M1) layer and comprises a base busbar and an emitter busbar. The first level metal comprises substantially orthogonal interdigitated metallization and substantially parallel interdigitated metallization positioned under and corresponding to the base and emitter busbars on the second level metal (M2). The substantially parallel interdigitated metallization of M1 collects carriers of opposite polarity of the corresponding busbar.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

The features, natures, and advantages of the disclosed subject matter may become more apparent from the detailed description set forth below when taken in conjunction with the drawings in which like reference numerals indicate like features and wherein:

FIGS. 9A and 9B are representative schematic cross-sectional view diagrams of a backplane-attached solar cell during different stages of solar cell processing;

DETAILED DESCRIPTION

Figure 1A:
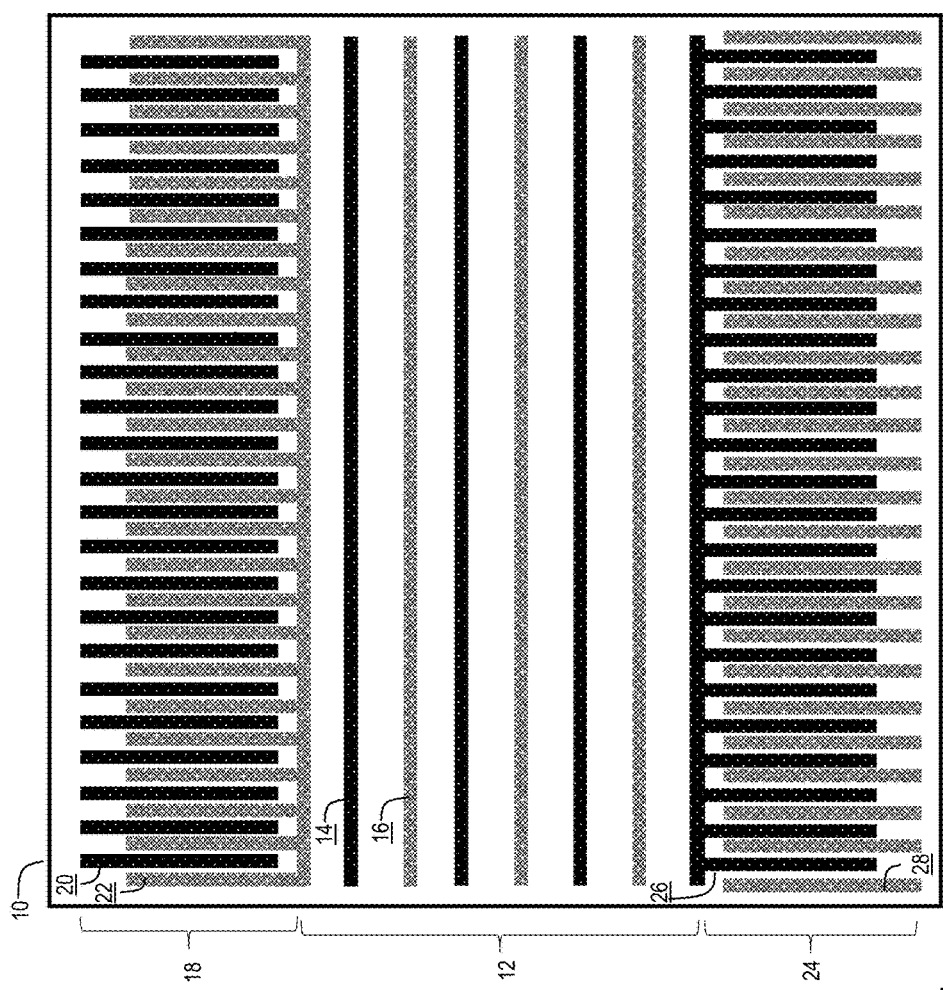
FIGS. 1A and 1B drawings of the backside of an interdigitated back contact solar cell showing a first level metal and a second level metal, respectively.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

And although the present disclosure is described with reference to specific embodiments and components, such as a back contact back junction solar cell, one skilled in the art could apply the principles discussed herein to other solar cell structures, fabrication processes (such as various plating methods and metallization materials), technical areas, and/or embodiments without undue experimentation. Importantly, the drawings provided herein depicting aspects of metallization patterns and solar cell cross-sections are not drawn to scale. Additionally, the metallization diagrams shown presented for descriptive purposes and may have different x and y axis scales.

The present application provides an effective and efficient solar cell current collection solution having substantially improved fabrication advantages. The novel solar cell and metallization structures described herein utilize a multi-layer metallization structure, such as a two-level metallization structure, comprising an on-cell base and emitter metallization first level metal (M1) and a second level metal (M2) collecting current from the first level metal. The second level metal (M2) may comprise an interdigitated pattern of base and emitter current collection fingers, base and emitter busbars, and also provide cell to cell (or sub-cell to sub-cell) interconnection. The first level metal (M1) comprises an interdigitated back contact metallization structure orthogonal/perpendicular to the interdigitated fingers of M2 and an interdigitated back metallization structure parallel to the interdigitated fingers of M2 (and perpendicular to the M2 base and emitter busbars). The M1 parallel interdigitated fingers are positioned underneath or beneath the M2 busbars (base and emitter) in relation the backside of the solar cell—or in other words the M2 busbars cover the M1 parallel interdigitated fingers—in order to maximize carrier collection under the M2 busbars (and in some instances to maximize current collection in the absence of a covering M2 metallization).

In a multi-level metallization design, for example a two level metal design comprising a first level on-cell metal M1 and a second level metal M2, M1 may comprise parallel interdigitated base and emitter lines and M2 serves as the connector between M1 base and emitter lines. The metal layers in the disclosed multi-level metal designs may be separated by a dielectric such as a resin/fiber based prepreg material. M1/M2 interconnection structures include conductive epoxy posts or in the case of an insulating layer (e.g., an insulating dielectric layer) positioned betweet M1 and M2 conductive material filled vias through the insulating layer.

The metallization structures provided herein internally connect a multi-level metallization structure, such as a two-level metallization structure comprising an M1 and M2 such that in cells regions covered by M2 busbars or in the absence of any M2 section directly above M1, current is collected by M1 and routed to the nearest conductive via plugs connecting M1 to M2. This structure provides increased carrier collection efficiency in areas covered by M2 busbars (e.g., base and emitter busbars or multiple busbars if required) and allows for exclusion of M2 directly above M1 (for example at the edges of the solar cell (in designs requiring recessed M2 pattern with some distance away from the edges) and in any other areas where necessary, including in the center of the cells). Solar cell base and emitter region patterns (e.g., P+ emitter, N+ base) are formed corresponding to and contacting the M1 structures disclosed herein.

Figure 1B:
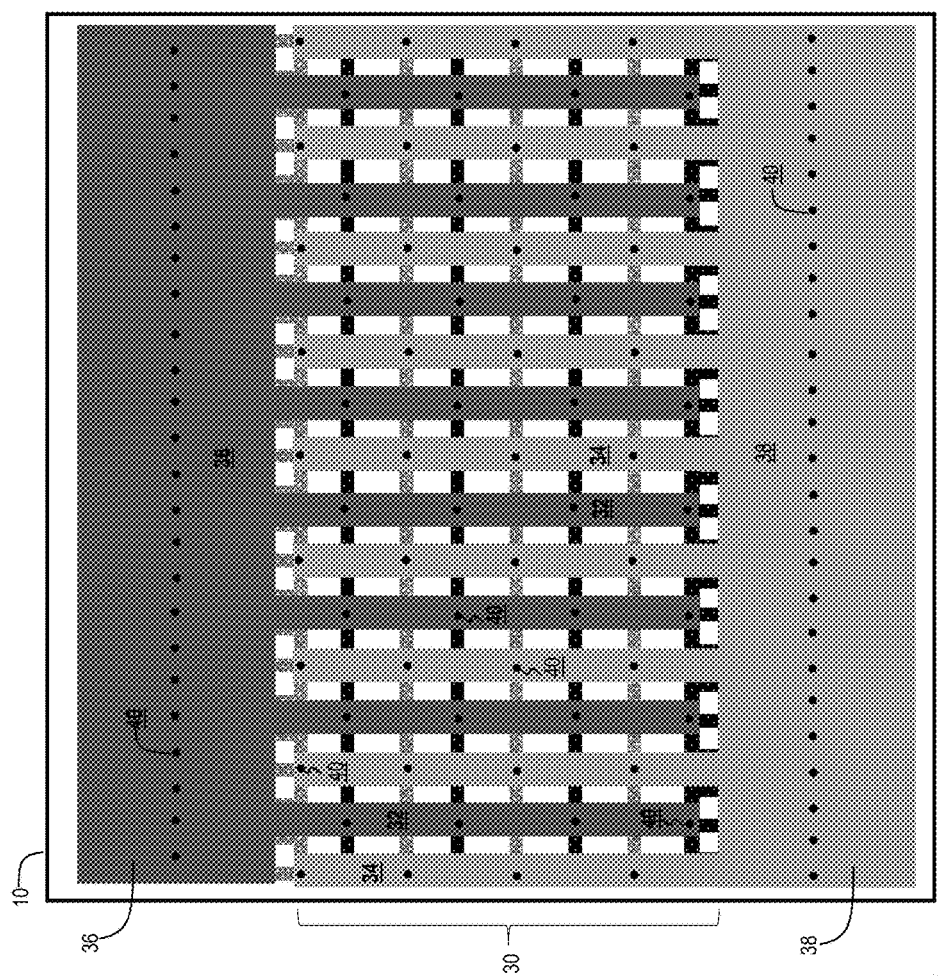

FIGS. 1A and 1B drawings of the backside of an interdigitated back contact solar cell showing a first level metal and a second level metal, respectively. FIG. 1A is drawing of the backside of a back contact back junction solar cell 10 showing a first level metal base and emitter metallization pattern (M1). The first level metal base and emitter metallization patterns shown herein correspond to base and emitter regions of the solar cell (not shown). Orthogonal (also referred to as perpendicular) interdigitated M1 pattern 12 comprises an interdigitated pattern of base fingers 14 and emitter fingers 16 patterned over the bulk of the back contact solar cell for majority and minority carrier collection (metallization patterns not shown to scale). M1 base parallel interdigitated pattern 18 and emitter parallel interdigitated pattern 24 are positioned under M2 base and emitter busbars, respectively—M1 base parallel interdigitated pattern 18 and emitter parallel interdigitated pattern 24 referred to herein as a caterpillar design. Base parallel interdigitated pattern 18 comprises an interdigitated pattern of base fingers 20 and emitter fingers 22 patterned parallel to the interdigitated fingers of M2 and perpendicular to the M2 base busbar covering base parallel interdigitated pattern 18. In other words, base parallel interdigitated pattern 18 is designed to reduce carrier lateral path (thus electrical shading) of holes (+) under the M2 base busbar. Emitter parallel interdigitated pattern 24 comprises an interdigitated pattern of base fingers 26 and emitter fingers 28 patterned parallel to the interdigitated fingers of M2 and perpendicular to the M2 emitter busbar covering emitter parallel interdigitated pattern 24. In other words, emitter parallel interdigitated pattern 24 is designed to reduce carrier lateral path (thus electrical shading) of electrons (−) under the M2 emitter busbar.

Note the pitch between orthogonal M1 base and emitter fingers and parallel M1 base and emitter fingers may be adjusted and in some instances, although depicted differently in the drawings, approximately equivalent.

FIG. 1B is drawing of the backside of an interdigitated back contact back junction solar cell 10 showing second level metallization (M2). Interdigitated M2 pattern 30 comprises an interdigitated pattern of base fingers 32 and emitter fingers 34 patterned over the bulk of the back contact solar cell and connected to the base and emitter metallization of M1, respectively, by electrically conductive via plugs 40 (metallization patterns not shown to scale). Further, base busbar 36 is connected to underlying base fingers 20 and emitter busbar 38 is connected to underlying emitter fingers 28 by conductive via plugs. Emitter fingers 22 collect and transfer minority carriers such as holes (+) (for solar cell with n-type-base) under M2 base busbar 36 to M2 emitter fingers 34 through conductive vias 40—here it should be noted although one conductive via 40 is shown for this transfer, and each transfer in the drawings provided, multiple via plugs (e.g., three vias per M2 emitter fingers 34 connecting M1 emitter fingers 22) and/or via size may be adjusted in accordance with M1/M2 current interconnection requirements. Base fingers 26 collect and transfer electrons (−) under M2 base busbar 38 to M2 base fingers 32 through conductive via plugs 40—again it should be noted although one conductive via plug 40 is shown for this transfer, and each transfer in the drawings provided, multiple via plugs and/or via size may be adjusted in accordance with M1/M2 current interconnection requirements.

Importantly, while base fingers 32 and emitter fingers 34 are shown as having a rectangular shape, base fingers 32 and emitter fingers 34 may be designed in a number of geometric or non-geometric designs. And particularly, base fingers 32 and emitter fingers 34 may be tapered with a wider side proximate the fingers corresponding busbar (i.e., base fingers 32 wider proximate base busbar 36 in FIG. 1B) to improve current collection efficiency.

Figure 2A:
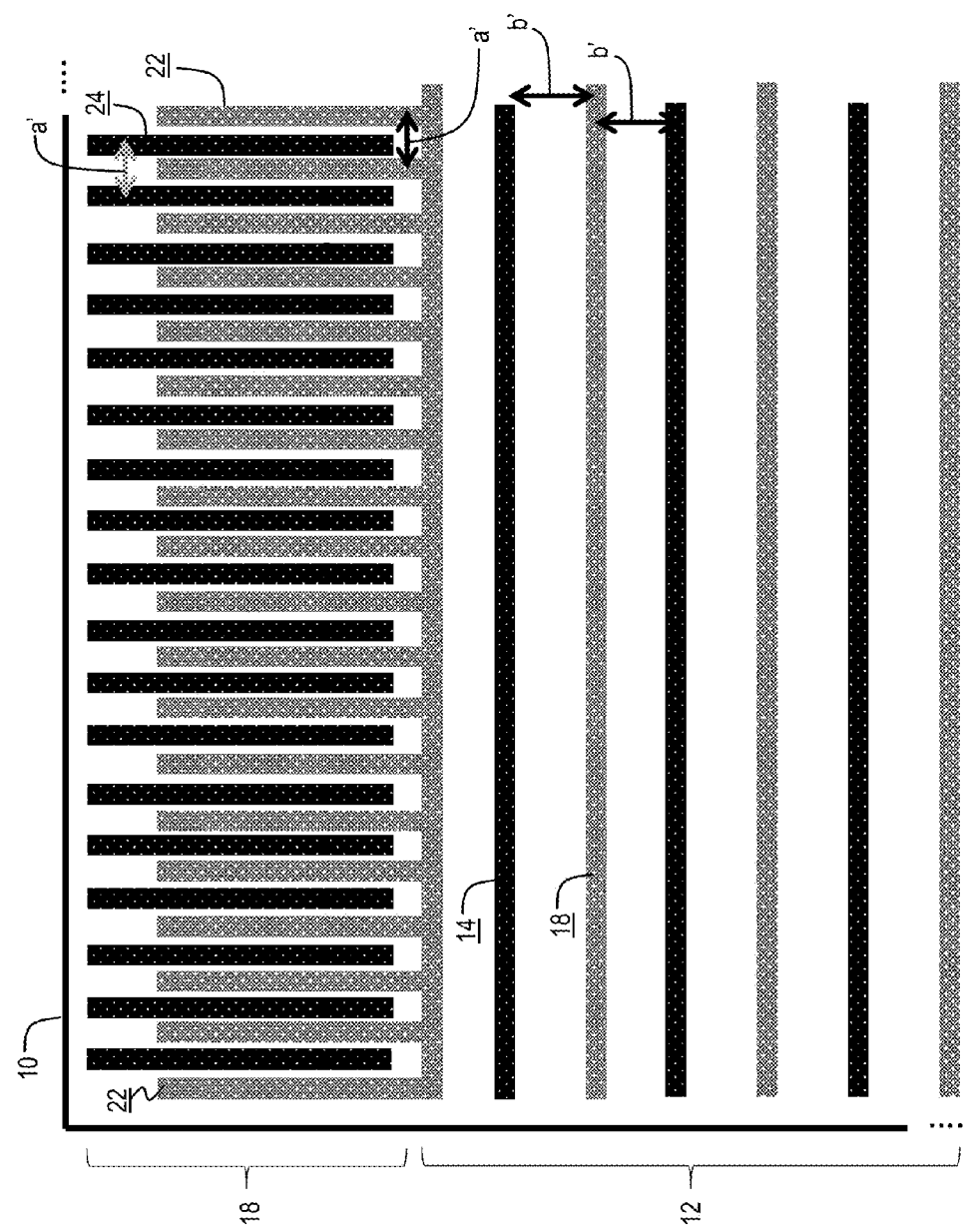
FIGS. 2A and 2B are diagrams showing increased/enlarged portions of FIGS. 1A and 1B, respectively (specifically the upper left corner of FIGS. 1A and 1B) for clarity.
Figure 2B:
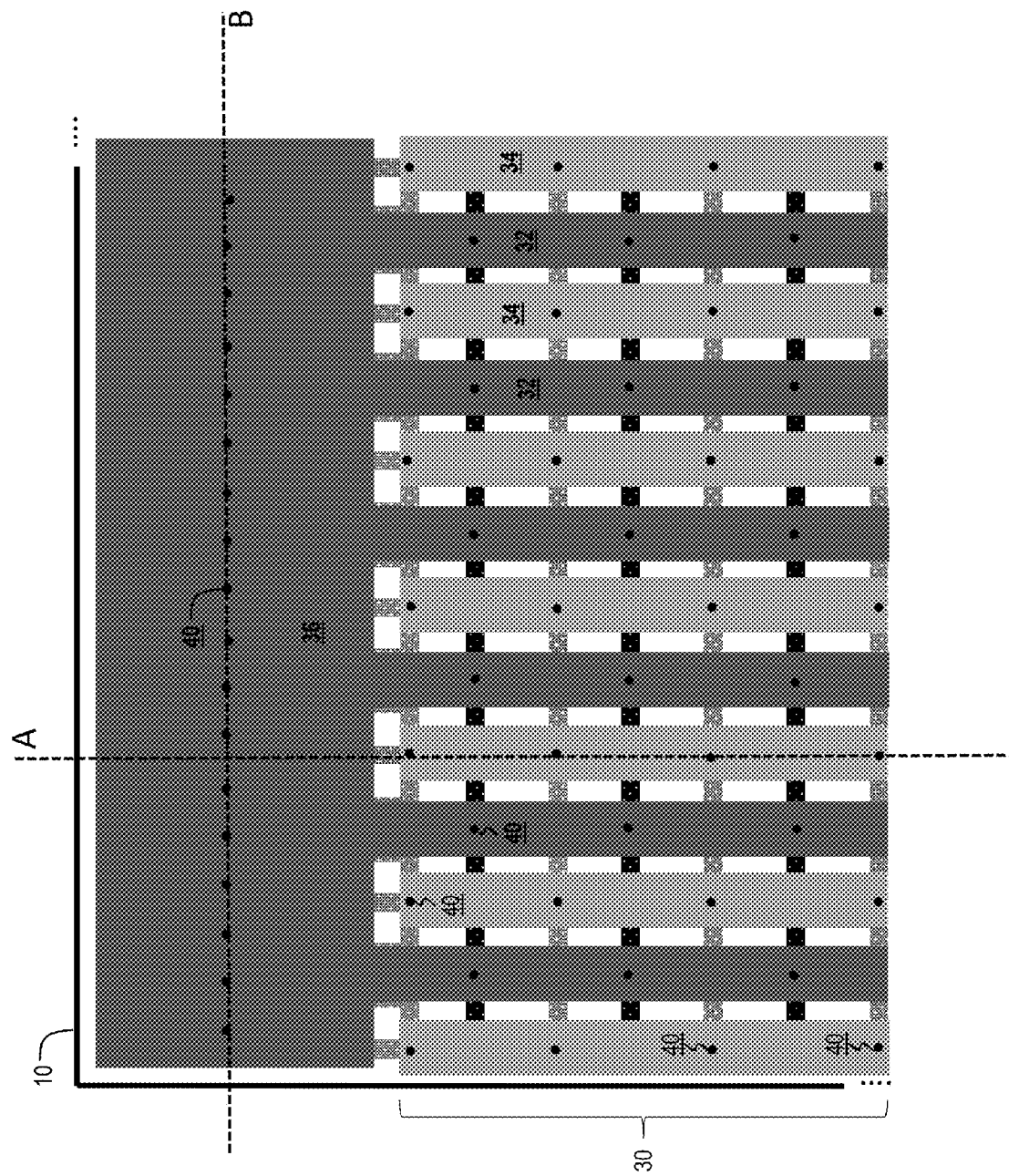

FIGS. 2A and 2B are diagrams showing increased/enlarged portions of FIGS. 1A and 1B, respectively (specifically the upper left corner of FIGS. 1A and 1B) for clarity.

A "caterpillar" M1 pattern utilizes base and emitter lines running perpendicular along two of the four edges and under the M2 busbars located on the same two cell edges and positioned above the caterpillar M1 pattern. These M1 lines collect current from the cell areas covered by M2 busbars and are connected to M2 fingers with conductive via plugs. These conductive via plugs (or vias) may be patterned so as to decrease the series resistance. For example, as shown in FIGS. 1A-1B and 2A-2B, M1 emitter lines 16 and 22 connect to M2 emitter lines 34 (M1 emitter lines 28 connect to M2 emitter busbar 38) and M1 base lines 14 and 26 connect to M2 base lines 32 (M1 base lines 20 connect to M2 base busbar 36) by vias 40.

The dimensions of drawings provided are not shown to scale. The following are provided as exemplary dimensional embodiments, however individual solar cells, metallization materials, and current requirements may dictate metallization pattern dimensions. For example, the pitch between like polarity fingers in the M1 parallel interdigitated pattern, shown as dimension a' in FIG. 2A, may be in the range of 0.25 to 3 millimeters and more particularly 0.9 to 1.3 millimeters. And the pitch between opposite polarity fingers in the M1 orthogonal interdigitated pattern, shown as dimension b' in FIG. 2A, may be in the range of 0.125 to 1.5 millimeters and more particularly 0.45 to 0.65 millimeters (in other words a pitch of approximately 0.9 to 1.3 millimeters between like polarity fingers in M1 orthogonal interdigitated pattern). Further, M2 busbars may have a width of 2 to 20 millimeters and more particularly 4 to 10 millimeters and a length as long as the length of the solar cell edge (e.g., ~156 mm for a 156 mm×156 mm solar cell). M2 fingers may also be tapered from 10 millimeters at the wider side (proximate the corresponding busbar) to 2 millimeters on the narrower side and more particularly from 6 millimeters on the wider side to 2 millimeters on the narrower side.

The M1 metallization structure described allows for busbars to be positioned in the top metal level (e.g., M2). These top level busbars (e.g., M2 busbars) may be used for testing and sorting and also electrically attached (soldering or conductive adhesive etc) to the module connections. Further, the M1 metallization structures may allow for plating and non-plating M2 metallization designs (e.g., M2 formed by PVD on a solar cell or sub-cell), and which may require single or multiple busbars per electrode in the middle of the solar cell or sub-cell.

Back contact metallization, M1 and M2, may be formed by processes such as PVD (sputtering and/or evaporation), plating, or combination of these and/or other known metallization processes (e.g., screen printing of metal paste, etc.). Further, exposure of sensitive solar cell areas during some fabrication methods, such as plating or screen printing, may lead to cell damage. To protect the solar cell frontside from the deleterious impact of wet chemicals (e.g., copper plating) during such metallization processes (e.g., plating), often a temporary or permanent frontside coating layer is deposited—thus restricting cell structure design and/or requiring additional fabrication process steps and/or dictating fabrication process flow to protect the cell during metallization (e.g., plating). Alternatively, a single sided fixture may be used during wet chemistry steps to seal and protect the cell frontside. A single sided fixture is a device used keep wet chemistry exposed only to the desired surfaces of the solar cell while avoiding exposure of the chemistry to other surfaces of the cell (e.g., a planar plate attached to the cell frontside) often requiring a sealing mechanism. However, sealing mechanisms, such as an o-ring seal, require at least a minimal portion of backside edge seal which limits the availability of busbar edge positioning. And while fixture protection has an advantage in that it protects the frontside of the solar cell (where plating is not desired for an IBC cell) without the need for a temporary/removable protection layer, cell frontside fixture protection may require M2 edge exclusion to ensure a reliable seal. Accordingly, wet metallization processing, such as plating or screen printing, may increase solar cell fabrication complexity.

Further, in some instances, large area M2 edge busbars may cause mechanical stress resulting in edge cracks and thus decrease the mechanical stability of the solar cell absorber edges.

In another embodiment, the metallization structures described herein may be extended as an edge exclusion M2—in other words M2 is recessed from the solar cell edge—to allow for wet fabrication (e.g., plating) of M2 and improve the mechanical stability of the solar cell absorber edges while collecting valuable carriers from the solar cell edge. solar cell edge. Recessing the M2 busbars from the edge and extending the sub M1 parallel interdigitated pattern under the M2 busbars to the solar cell edge allows for current collection along the solar cell edge with minimal series resistance loss. M2 edge exclusion can greatly simplify processes such as wet chemical plating, where there is a need to protect the frontside of the wafer from deleterious impacts of wet chemicals and copper in the case of copper plating. M2 edge exclusion allows for improved edge sealing, such as wrap around seals or o-ring seals to the cell backside (metallization side). Thus, the innovations disclosed herein allow for solar cell design having a relatively large cell area without M2 coverage without incurring a cell performance penalty.

Figure 3:
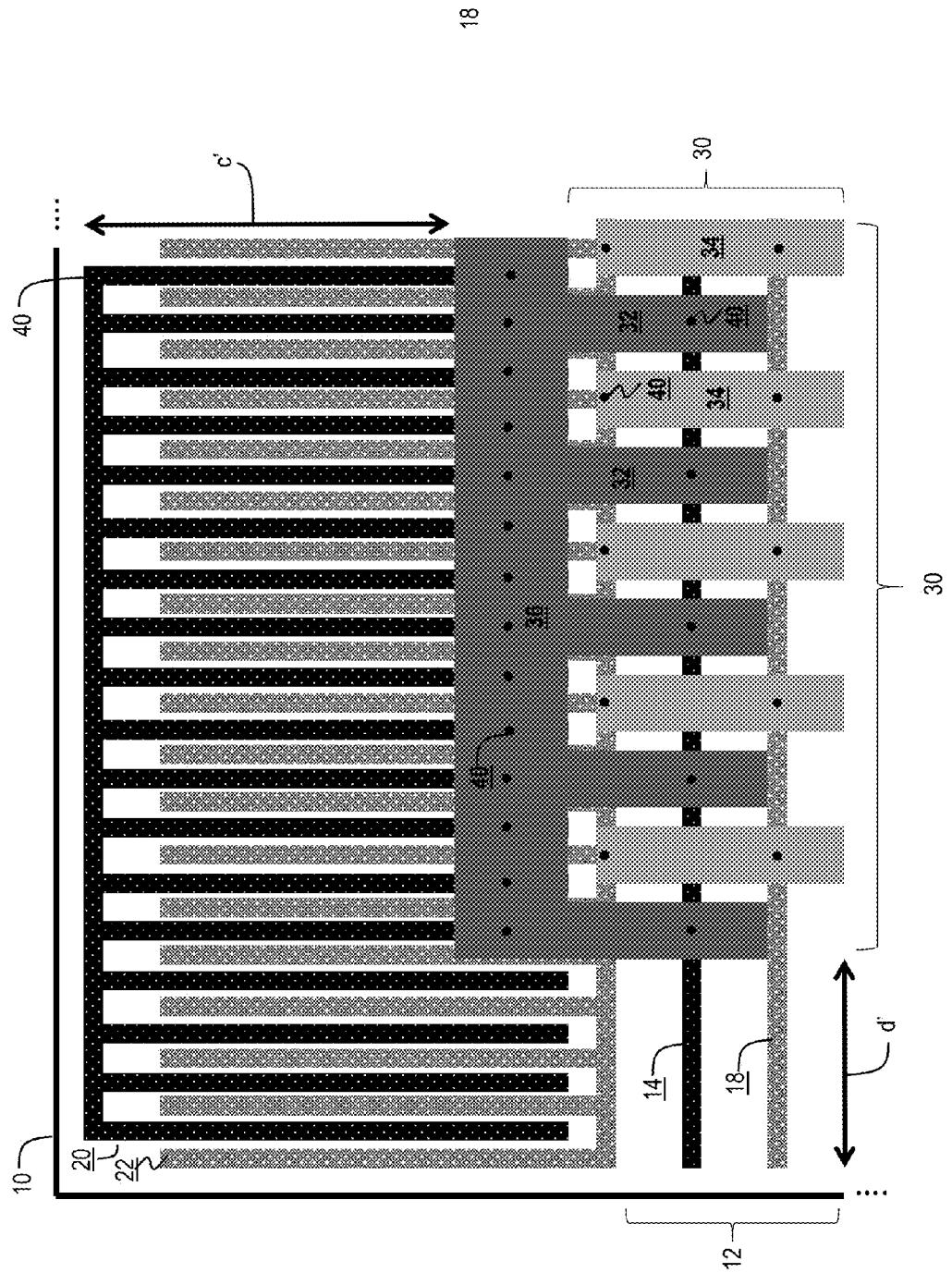
FIG. 3 is drawing showing a recessed second level metallization (M2) on the backside of a portion of interdigitated back contact back junction solar cell.

FIG. 3 is drawing showing a recessed second level metallization (M2) on the backside of a portion of interdigitated back contact back junction solar cell 10. The M1 and M2 structure of FIG. 3 is consistent with that of FIGS. 1A and 1B except where M2 is recessed from the solar cell edge (as shown M2 is recessed from the cell edge and M1 by dimensions c' and d'). Recessing the M2 busbars from the edge and extending the sub M1 parallel interdigitated pattern (comprising parallel M1 base lines 20 and parallel M1 emitter lines 22) extends from under the M2 busbar to the solar cell edge (shown as dimension c') and allows for current collection along the solar cell edge with minimal series resistance loss.

M1 edge connector 40 provides current transfer along the cell edge and M1 parallel interdigitated fingers (as shown in FIG. 3, base edge connecter 40 connecting parallel M1 base lines 20). A recessed/edge exclusion M2 allows for a relatively large cell area without full-area M2 coverage while collecting current across the entirety of the cell. Advantages associated with a recessed M2 include, but are not limited to: 1) allows for M2 deposition using plating in a fixture requiring wrap-around edge sealing; 2) allows for M2 deposition without the need for a temporary or permanent frontside protection cover/layer, for example frontside plating using a fixture; 3) reduces bowing and cracking at the cell edges, particularly applicable to thin film solar cells, and mitigates the impact of these edge defects on metallization; 4) substantially mitigates the risk of copper contamination of the solar cell peripheral sidewalls and frontside.

Figure 4A:
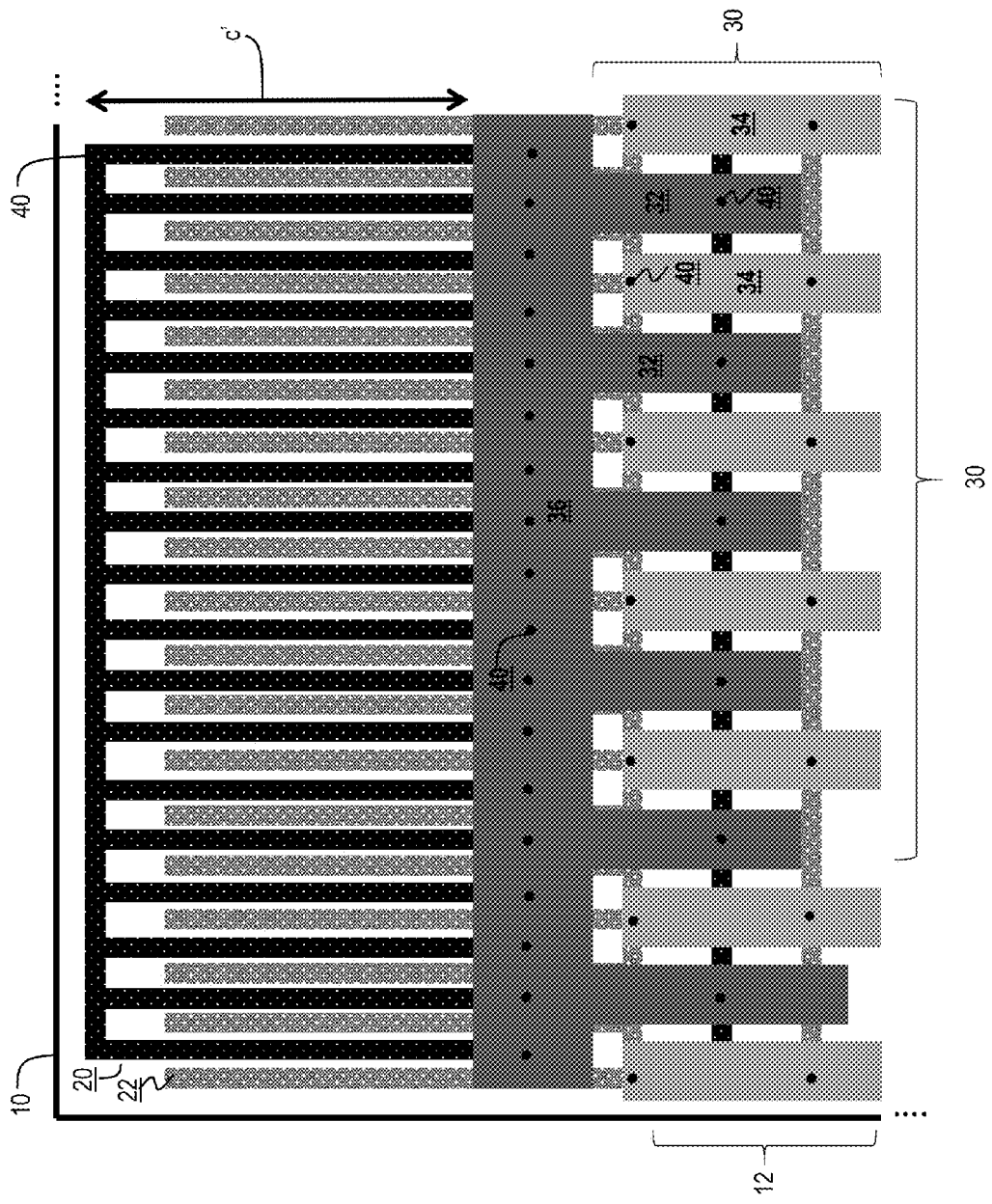
FIG. 4A is drawing showing a hybrid embodiment of a recessed second level metallization (M2) on the backside of a portion of interdigitated back contact back junction solar cell.
Figure 4B:
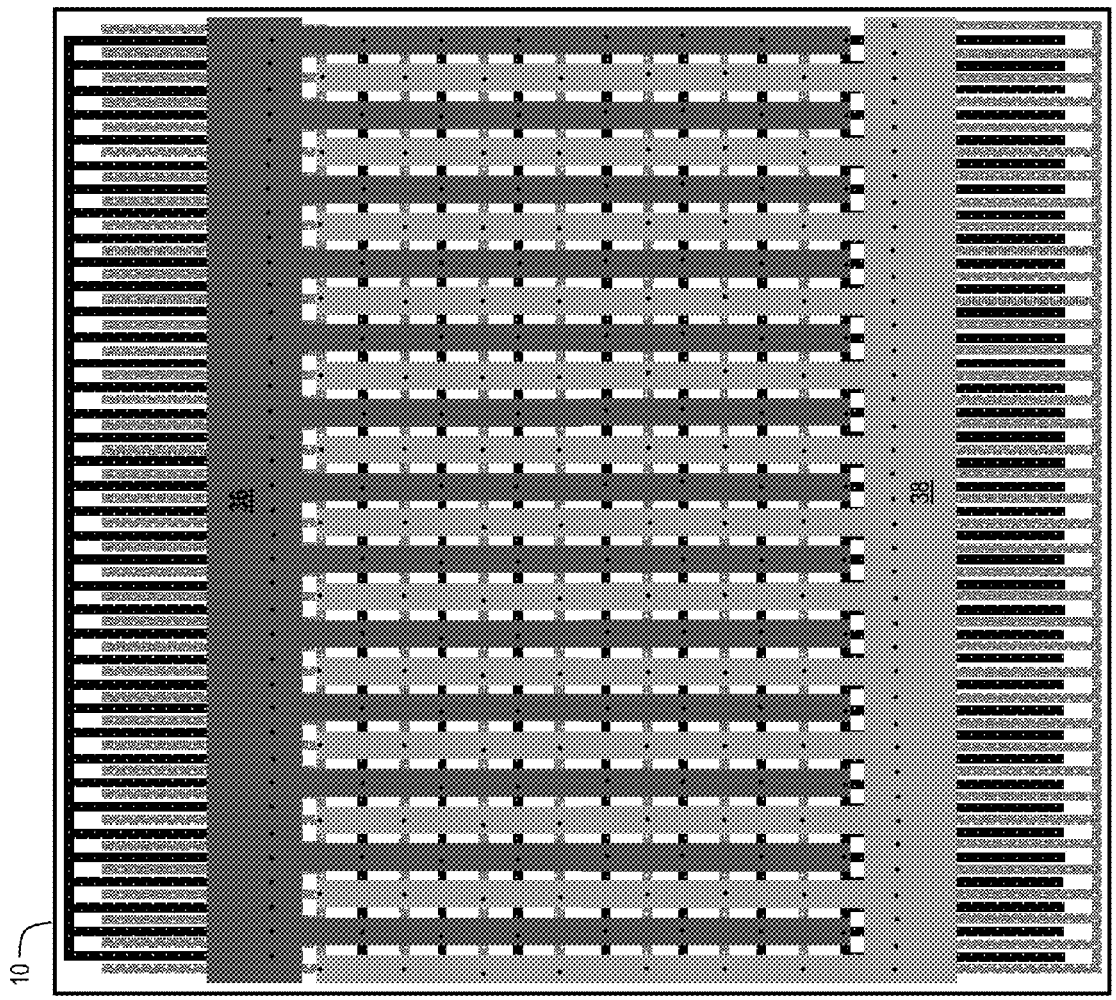
FIG. 4B is drawing showing a hybrid embodiment of a recessed second level metallization (M2) on the backside of a full back contact back junction solar cell.

FIG. 4A is drawing showing a hybrid embodiment of a recessed second level metallization (M2) on the backside of a portion of interdigitated back contact back junction solar cell 10. The M1 and M2 structure of FIG. 4A is consistent with that of FIGS. 1A and 1B except where M2 is recessed from the solar cell edge (as shown M2 is recessed from the cell edge and M1 by dimensions c'). M1 parallel interdigitated pattern (comprising parallel M1 base lines 20 and parallel M1 emitter lines 22) extends from under the M2 busbar to the solar cell edge (shown as dimension c') and allows for current collection along the solar cell edge with minimal series resistance loss. Optional M1 edge connector 40 may be used to provide current transfer along the cell edge and M1 parallel interdigitated fingers (as shown in FIG. 4A, base edge connecter 40 connecting parallel M1 base lines 20). FIG. 4B is drawing showing a hybrid embodiment of a recessed second level metallization (M2) on the backside of a full back contact back junction solar cell 10 consistent with FIG. 4A and provided for descriptive purposes.

Figure 5:
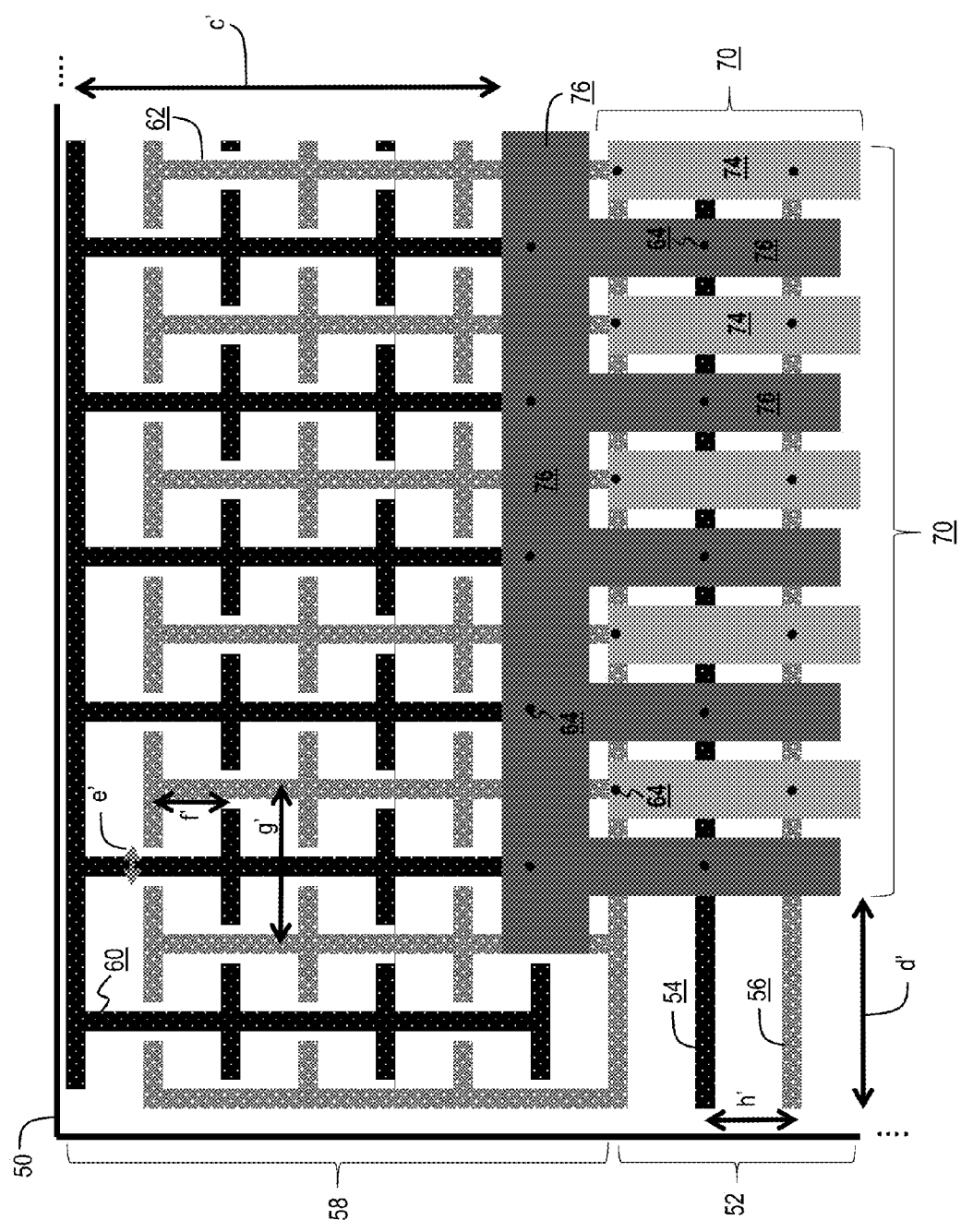
FIG. 5 is drawing of the backside of a portion of a back contact back junction solar cell 50 showing second level metallization (M2) and first level metallization (M1)

FIG. 5 is drawing of the backside of a portion of a back contact back junction solar cell 50 showing second level metallization (M2) and first level metallization (M1) having a parallel interdigitated pattern referred to herein as conifer. In the conifer embodiment shown, M2 is recessed, however this structure is equally applicable as a non-recessed structure as shown in the caterpillar structure of FIGS. 1A and 1B. The first level metal base and emitter metallization patterns shown herein correspond to base and emitter regions of the solar cell (not shown).

FIG. 5 shows a portion of the backside of back contact back junction solar cell 50; this structure may be extended symmetrically across the entirety of the solar cell. The design on the opposite edge of the cell is the same with reversed polarities (see FIGS. 1A and 1B). As shown in FIG. 5, orthogonal interdigitated M1 pattern 52 comprises an interdigitated pattern of base fingers 54 and emitter fingers 56 patterned over the bulk of the back contact solar cell for carrier collection (metallization patterns not shown to scale). M1 base parallel interdigitated pattern 58 (emitter parallel interdigitated pattern positioned at the opposite cell edge and not shown) is positioned under M2 base busbar 76 (M2 emitter busbar positioned at the opposite cell edge and not shown)—M1 base parallel interdigitated pattern 58 (and emitter parallel interdigitated pattern not shown) referred to herein as a conifer design. Base parallel interdigitated pattern 58 comprises an interdigitated pattern of base fingers 60 and emitter fingers 62 patterned parallel to the interdigitated fingers of M2 in a conifer design (M2 base fingers 72 and M2 emitter fingers 74) and perpendicular to M2 base busbar 76 covering base parallel interdigitated pattern 58. Base parallel interdigitated pattern 58 is designed to reduce carrier lateral path (thus electrical shading) of holes (+) under the M2 base busbar and along the cell edge without M2 coverage. M1 edge base connector 80 provides current transfer along the cell edge and M1 parallel interdigitated base fingers. Interdigitated M2 pattern 70 comprises an interdigitated pattern of base fingers 72 and emitter fingers 74 patterned over the bulk of the back contact solar cell and connected to the base and emitter metallization of M1, respectively, by conductive vias/epoxy 64 (metallization patterns not shown to scale). Further, base busbar 76 is connected to underlying base fingers 60.

Emitter fingers 62 collect and transfer minority carriers, such as holes (+) under M2 base busbar 76 and along the cell edge without M2 coverage to M2 emitter fingers 74 through conductive vias 64—here it should be noted although one conductive via plug 64 is shown for this transfer, and each transfer in the drawings provided, multiple conductive via plugs and/or via size may be adjusted in accordance with M1/M2 current interconnection requirements A "conifer" M1 pattern utilizes base and emitter lines having a cross pattern and running perpendicular along two of the four edges. These M1 lines collect current from the cell areas covered by M2 busbars and the areas without M2 interdigitated pattern coverage and are connected to M2 fingers with vias similarly to the connections described and shown for the caterpillar pattern in FIGS. 1A-1B and 2A-2B. The design on the opposite edge of the cell is the same with the polarities reversed.

The dimensions of drawings provided are not shown to scale. The following are provided as exemplary dimensional embodiments, however individual solar cells, metallization materials, and current requirements may dictate metallization pattern dimensions. For example, the pitch between like polarity fingers in the M1 parallel interdigitated pattern, shown as dimension g' in FIG. 5, may be in the range of 2 millimeters to 15 millimeters and more particularly 8 millimeters. And the pitch between opposite polarity "crosses"

of the M1 parallel interdigitated pattern, shown as dimension f' in FIG. 5, may be in the range of 0.125 millimeters to 1.5 millimeters and more particularly 0.65 millimeters. The distance between perpendicular "crosses" of like polarity, shown as dimension e' in FIG. 5, may be in the range of 0.2 millimeters to 2 millimeters and more particularly 0.95 millimeters. And the pitch between opposite polarity fingers in the M1 orthogonal interdigitated pattern, shown as dimension h' in FIG. 5, may be in the range of 0.125 millimeters to 1.5 millimeters and more particularly 0.45 to 0.65 millimeters (in other words a pitch of approximately 0.9 to 1.3 millimeters between like polarity fingers in M1 orthogonal interdigitated pattern). Further, M2 busbars may have a width of . . . (include more exemplary metallization dimensions). The rest of the cell area has lines running perpendicular to the lines separated by 8 mm.

Figure 6:
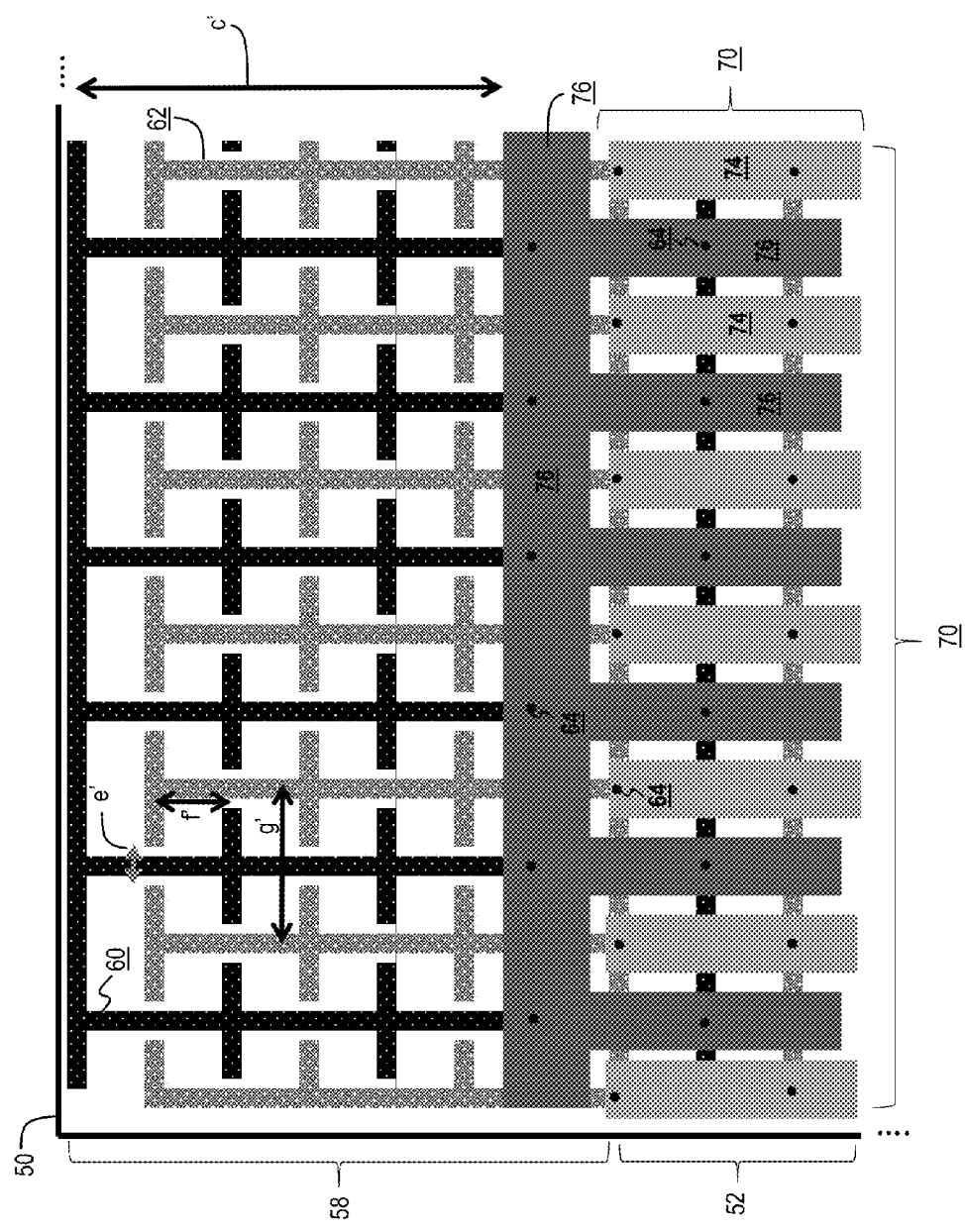
FIG. 6 is drawing showing a hybrid embodiment of a recessed second level metallization (M2) on the backside of a portion of back contact back junction solar cell.

FIG. 6 is drawing showing a hybrid embodiment of a recessed second level metallization (M2) on the backside of a portion of back contact back junction solar cell 50. The M1 and M2 structure of FIG. 6 is consistent with that of FIG. 5 except where M2 is recessed from the solar cell edge (as shown M2 is recessed from the cell edge and M1 by dimensions c'). M1 parallel interdigitated pattern (comprising parallel M1 base lines 60 and parallel M1 emitter lines 62) extends from under the M2 busbar to the solar cell edge (shown as dimension c') and allows for current collection along the solar cell edge with minimal series resistance loss. Optional M1 edge connector 80 may be used to provide current transfer along the cell edge and M1 parallel interdigitated fingers (as shown in FIG. 5, base edge connecter 80 connecting parallel M1 base lines 60).

Figure 7A:
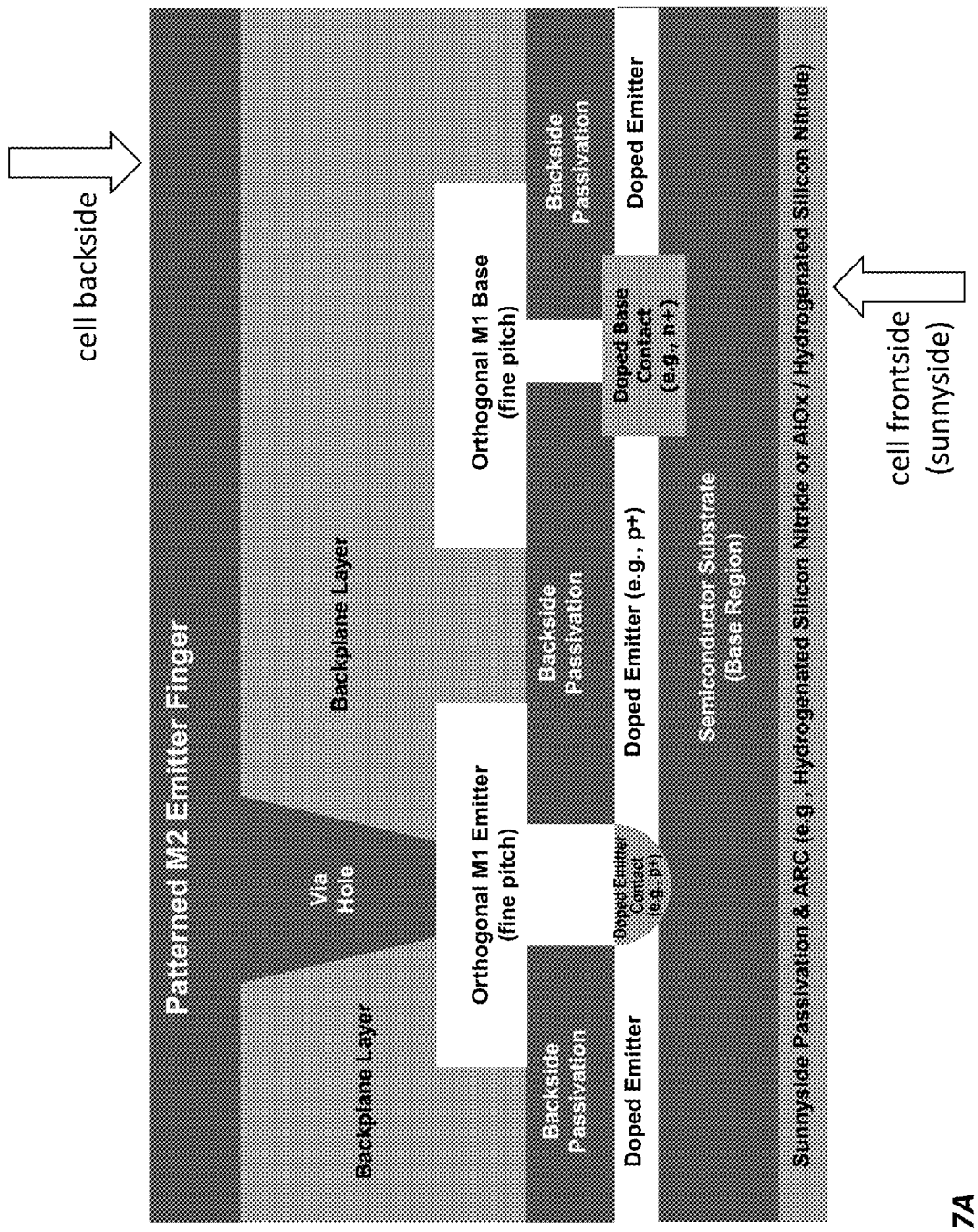
FIGS. 7A and 7B are selected cross-sectional diagrams along cross-sectional axis A and cross-sectional axis B in FIG. 2B, respectively.
Figure 7B:
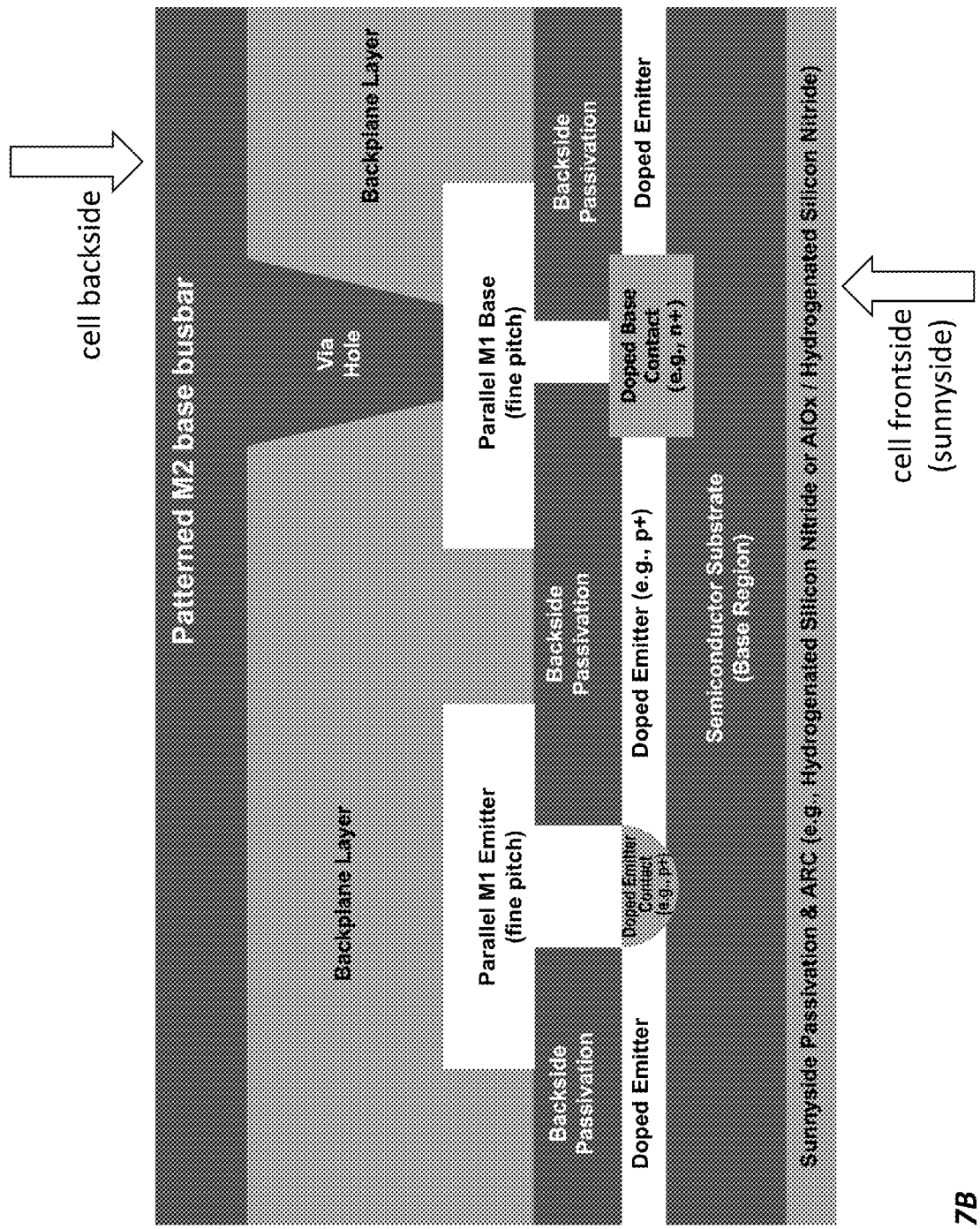

FIGS. 7A and 7B are selected cross-sectional diagrams along cross-sectional axis A and cross-sectional axis B in FIG. 2B, respectively, and are provided as descriptive embodiments to further detail cell architectures which may be used in accordance with the disclosed subject matter. FIG. 7A is a cross-sectional diagram showing an expanded view of the solar cell of FIG. 2B along the A cross-sectional axis and showing M2 emitter finger 34 connection to orthogonal M1 emitter fingers 16. FIG. 7B is a cross-sectional diagram showing an expanded view of the solar cell of FIG. 2B along the B cross-sectional axis and showing M2 base busbar 36 connection to parallel M1 base fingers 20. Note the pitch between orthogonal M1 base and emitter fingers and parallel M1 base and emitter fingers may be adjusted and in some instances, although depicted differently in the drawings, approximately equivalent.

Advantages of metallization innovations disclosed herein, include but are not limited to:
Current collection from cell areas covered by a busbar (often cell edges) with minimal series resistance loss.
Current collection from cell areas not covered by M2 (e.g., in the case of an edge recessed M2) with minimal series resistance loss. Recessed M2 enables single sided plating and eliminates the need for a protective cell frontside permanent coating during plating. Thus improving the efficiency of the cell and reducing complexity during module fabrication.
Allows for placement of busbars on M2 and variations in M2 design, such as a in a solar cell having a plurality of sub-cells.
M2 busbars allows for individual solar cell or sub-cell testing, sorting and binning after the cell fabrication process.
A recessed M2 may reduce cracks at the solar cell edges.
Efficient parallel M1 interdigitated finger structure allows for reliable M2 interconnection not requiring a solder connection on each parallel M1 interdigitated finger (thus reducing potential solder connection failure).

The M1 and M2 metallization layers described herein may be separated by a dielectric layer and connected by conductive vias through the dielectric layer—alternatively the M1 and M2 metallization layers may be electrically connected by conductive posts. The metal layer close to solar cell (M1) may be deposited using physical methods (PVD, paste printing) or using chemical techniques (CVD). The dielectric layer may then be deposited using a myriad of deposition schemes including, but not limited to, screen printing or may be a lamination of dielectric materials with binding resin. In either case, vias may be drilled subsequent to the deposition/lamination/attachment using mechanical, chemical, or laser drilling techniques. Alternatively, the dielectric may be deposited in a pattern leaving the via openings uncovered during deposition, or in the case of lamination the via holes may be predrilled in the laminate. The vias may then cleaned using plasma sputtering, reactive species plasma or wet chemistry. In one M2 fabrication embodiment, the seed layer for top level metal layer (M2) is deposited using PVD, ink jet or screen printing and subsequently a thick metal is plated onto the seed layer to reduce the line resistance and resistance in the vias. The front-side of the cell (for example having an anti-reflective coating layer ARC layer) should be protected from the plating and etching bath. In one embodiment, a single-sided fixture is attached to the cell front-side during the wet chemistry steps during plating and subsequent metal etch patterning to define the M2 lines. Alternative cell frontside protection methods include a removable or permanent coating on the frontside during plating. Permanent coating increases the reflectivity of the cell and increases complexity at module assembly. However, in many instances, using a single-sided fixture or an otherwise removable coating method requiring a wrap-around seal, the cell cannot be plated all the way to the edge and M2 may be recessed. In the case of a recessed M2, the M1 pattern may be designed such that the current is also collected from the areas with minimal loss in series resistance—such as by extending the parallel M1 interdigitated fingers from the M2 busbar to the cell edge. Thus, single sided plating may be utilized and busbars positioned in M2. Recessing busbars from the cell edge may also improves mechanical stability of solar cell (e.g., thin film silicon) at the edges.

The dual-level metallization back contact solar cells described herein may be formed on a thin film silicon substrate formed using an epitaxial growth process or a mono-crystalline, quasi mono-crystalline, or multi-crystalline silicon CZ wafer. Tables 1 and 2 below present two process flow embodiments and corresponding processing steps for the formation of a thin crystalline (having a thickness in the range of approximately 5 to 100 um) back-contact back junction solar cell with dual-level metallization from an epitaxially grown substrate (Table 1 beginning at porous layer formation in a porous silicon/epitaxial substrate deposition/release process) and from a CZ wafer (Table 2).

TABLE 1

Epitaxial based thin mono-crystalline (5 um to 100 um) back-contact back-junction solar cell with dual level metallization process flow.

| 1. Porous Silicon | Anodic Etch |
| 2. Silicon Epitaxy | Epi Tool |
| 3. BSG Deposition | APCVD |

TABLE 1-continued

Epitaxial based thin mono-crystalline (5 um to 100 um) back-contact back-junction solar cell with dual level metallization process flow.

| | | |
|---|---|---|
| 4. BSG Opening | Laser | |
| 5. PSG Deposition | APCVD | |
| 6. Anneal/Back passiv. | Furnace | |
| 7. Open Contact | Laser | |
| 8. Al Paste Print, Dry | Screen Print | |
| 9. Anneal | Laser | |
| 10. Backplane, Release | Laminator, MR | |
| 11. Texturization | Wet Etch | |
| 12. Front Passivation | PECVD | |
| 13. Backplane Holes | CO2 Laser | |
| 14. Metallization | Plating | |

TABLE 2

Harmonized process flow for CZ wafer based thin mono-crystalline, quasi mono-crystalline, or multi-crystalline back-contact back-junction solar cell with dual level metallization.

| | |
|---|---|
| 1. BSG Deposition | APCVD |
| 2. BSG Opening | Laser |
| 3. PSG Deposition | APCVD |
| 4. Anneal/Back passiv. | Furnace |
| 5. Open Contact | Laser |
| 6. Al Paste Print, Dry | Screen Print |
| 7. Anneal | Laser |
| 8. Backplane | Laminator |
| 9. Si Cut | Laser |
| 10. Texturization | Wet Etch |
| 11. Front Passivation | PECVD |
| 12. Backplane Holes | CO2 Laser |
| 13. Metallization | PVD |
| 14. Metal pattern | Laser |

A more detailed epitaxial based back contact solar cell process flow is provided below. Numerous aspects of this process flow, and particularly those relating to metallization, are applicable to non-epitaxial based back contact solar cells. Starting with a reusable silicon template, for example made of a p-type monocrystalline silicon wafer, a thin sacrificial layer of porous silicon is formed (for example by an electrochemical etch process through a surface modification process in an HF/IPA wet chemistry in the presence of an electrical current). The starting material or reusable template may be a single crystalline silicon wafer, for example formed using crystal growth methods such as FZ, CZ, MCZ (Magnetic stabilized CZ), and may further comprise epitaxial layers grown over such silicon wafers. The semiconductor doping type may be either p or n and the wafer shape, while most commonly square shaped, may be any geometric or non-geometric shape such as quasi-square or round.

Upon formation of the sacrificial porous silicon layer, which serves both as a high-quality epitaxial seed layer as well as a subsequent separation/lift-off layer, a thin layer (for example a layer thickness in the range of a few microns up to about 70 microns, or a thickness less than approximately 50 microns) of in-situ-doped monocrystalline silicon is formed, also called epitaxial growth. The in-situ-doped monocrystalline silicon layer may be formed, for example, by atmospheric-pressure epitaxy using a chemical-vapor deposition or CVD process in ambient comprising a silicon gas such as trichlorosilane or TCS and hydrogen.

Prior to backplane lamination, the solar cell base and emitter contact metallization pattern is formed directly on the cell backside, for instance using a thin layer of screen printed or sputtered (PVD) or evaporated aluminum (or aluminum silicon alloy or Al/NiV/Sn stack) material layer. This first layer of metallization (herein referred to as M1) defines the solar cell contact metallization pattern, for example fine-pitch interdigitated back-contact (IBC) conductor fingers defining the base and emitter regions of the IBC cell. The M1 layer extracts the solar cell current and voltage and transfers the solar cell electrical power to the second level/layer of higher-conductivity solar cell metallization (herein referred to as M2) formed after M1.

After completion of a majority of solar cell processing steps, a very-low-cost backplane layer may be bonded to the thin epi layer for permanent cell support and reinforcement as well as to support the high-conductivity cell metallization of the solar cell. The backplane material may be made of a thin (for instance, a thickness in the range of approximately 50 to 250 microns and in some instances in the range of 50 to 150 microns), flexible, and electrically insulating polymeric material sheet such as an inexpensive prepreg material commonly used in printed circuit boards which meets cell process integration and reliability requirements. The mostly-processed back-contact, back junction backplane-reinforced large-area (for instance, a solar cell area of at least 125 mm×125 mm, 156 mm×156 mm, or larger) solar cell is then separated and lifted off from the template along the mechanically-weakened sacrificial porous silicon layer (for example through a mechanical release MR process) while the template may be re-used many times to further minimize solar cell manufacturing cost. Final cell processing may then be performed on the solar cell sunny-side which is exposed after being released from the template. Sunny-side processing may include, for instance, completing frontside texturization and passivation and anti-reflection coating deposition process.

After formation of the backplane (on or in and around M1 layer), subsequent detachment of the backplane-supported solar cell from the template along the mechanically weak sacrificial porous silicon layer, and completion of the frontside texture and passivation processes, a higher conductivity M2 layer is formed on the backplane. Via holes (in some instances up to hundreds or thousands of via holes) are drilled into the backplane (for example by laser drilling) and may have diameters in the range of approximately 50 up to 500 microns. These via holes land on pre-specified regions of M1 for subsequent electrical connections between the patterned M2 and M1 layers through conductive plugs formed in these via holes. Subsequently or in conjunction with the via holes filling and conductive plug formation, the patterned higher-conductivity metallization layer M2 is formed (for example by plasma sputtering, plating, evaporation, or a combination thereof—using an M2 material comprising aluminum, Al/NIV, Al/NiV/Sn, or copper). For an interdigitated back-contact (IBC) solar cell with fine-pitch IBC fingers on M1 (for instance, hundreds of fingers), the patterned M2 layer may be designed orthogonal to M1—in other words rectangular or tapered M2 fingers are essentially perpendicular to the M1 fingers. Because of this orthogonal transformation, the M2 layer may have far fewer IBC fingers than the M1 layer (for instance, by a factor of about 10 to 50 fewer M2 fingers). Hence, the M2 layer may be formed in a much coarser pattern with wider IBC fingers than the M1 layer. Solar cell busbars may be positioned on the M2 layer, and not on the M1 layer (in other words a busbarless M1), to eliminate electrical shading losses associated with on-cell busbars. As both the base and emitter interconnections and busbars may be positioned on the M2 layer on the solar cell backside backplane, electrical access is provided to both the base and emitter terminals of the solar cell on the backplane from the backside of the solar cell.

The backplane material formed between M1 and M2 may be a thin sheet of a polymeric material with sufficiently low coefficient of thermal expansion (CTE) to avoid causing excessive thermally induced stresses on the thin silicon layer. Moreover, the backplane material should meet process integration requirements for the backend cell fabrication processes, in particular chemical resistance during wet texturing of the cell frontside and thermal stability during the PECVD deposition of the frontside passivation and ARC layer. The electrically insulating backplane material should also meet the module-level lamination process and long-term reliability requirements. While various suitable polymeric (such as plastics, fluropolymers, prepregs, etc.) and suitable non-polymeric materials (such as glass, ceramics, etc.) may be used as the backplane material, backplane material choice depends on many considerations including, but not limited to, cost, ease of process integration, reliability, pliability, etc.

A suitable material choice for the backplane material is prepreg. Prepreg sheets are used as building blocks of printed circuit boards and may be made from combinations of resins and CTE-reducing fibers or particles. The backplane material may be an inexpensive, low-CTE (typically with CTE<10 ppm/° C., or with CTE<5 ppm/° C.), thin (for example 50 to 250 microns, and more particularly in the range of about 50 to 150 microns) prepreg sheet which is relatively chemically resistant to texturization chemicals and is thermally stable at temperatures up to at least 180° C. (or as high as at least 280° C.). The prepreg sheet may be attached to the solar cell backside while still on the template (before the cell lift off process) using a vacuum laminator. Upon applying heat and pressure, the thin prepreg sheet is permanently laminated or attached to the backside of the processed solar cell. Then, the lift-off release boundary is defined around the periphery of the solar cell (near the template edges), for example by using a pulsed laser scribing tool, and the backplane-laminated solar cell is then separated from the reusable template using a mechanical release or lift-off process. Subsequent process steps may include: (i) completion of the texture and passivation processes on the solar cell sunnyside, (ii) completion of the solar cell high conductivity metallization on the cell backside (which may comprise part of the solar cell backplane). The high-conductivity metallization M2 layer (for example comprising aluminum, copper, or silver) comprising both the emitter and base polarities is formed on the laminated solar cell backplane.

Generally, prepregs are reinforcing materials pre-impregnated with resin and ready to use to produce composite parts (prepregs may be used to produce composites faster and easier than wet lay-up systems). Prepregs may be manufactured by combining reinforcement fibers or fabrics with specially formulated pre-catalyzed resins using equipment designed to ensure consistency. Covered by a flexible backing paper, prepregs may be easily handled and remain pliable for a certain time period (out-life) at room temperature. Further, prepreg advances have produced materials which do not require refrigeration for storage, prepregs with longer shelf life, and products that cure at lower temperatures. Prepreg laminates may be cured by heating under pressure. Conventional prepregs are formulated for autoclave curing while low-temperature prepregs may be fully cured by using vacuum bag pressure alone at much lower temperatures.

FIG. 1B is a drawing showing an example of a backside of a back contact back junction solar cell having in accordance with the process flow described above. Alternatively, the M1 and M2 metallization structures disclosed herein may be utilized at a sub-cell level (e.g., a solar cell comprising a plurality of sub-cells). For example, a monolithically isled solar cell (referred to herein as an icell) such as described in detail below.

Figure 8:
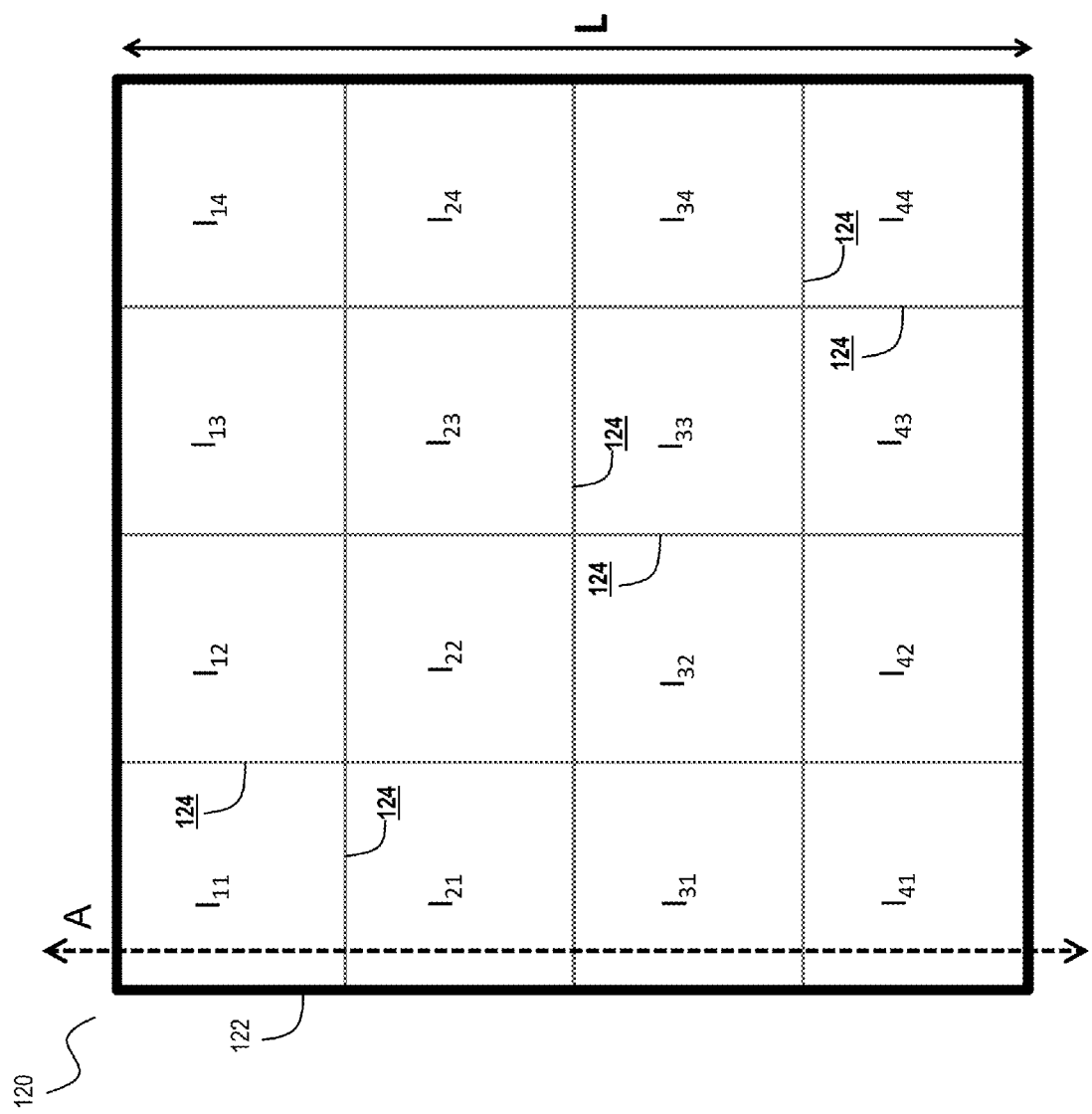
FIG. 8 is a representative schematic plan view (frontside or sunnyside view) diagram of an icell pattern.

FIG. 8 is a representative schematic plan view (frontside or sunnyside view) diagram of an icell pattern (shown for square-shaped isles and square-shaped icell) along with uniform-size (equal-size) square-shaped isles for N×N=4× 4=16 isles (or sub-cells, mini-cells, tiles). This schematic diagram shows a plurality of isles (shown as 4×4=16 isles) partitioned by trench isolation regions. FIG. 8 is a schematic diagram of a top or plan view of a 4×4 uniform isled (tiled) master solar cell or icell 210 defined by cell peripheral boundary or edge region 122, having a side length L, and comprising sixteen (16) uniform square-shaped isles formed from the same original continuous substrate and identified as $I_{11}$ through $I_{44}$ attached to a continuous backplane on the master cell backside (backplane and solar cell backside not shown). Each isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and in some instances less than or equal to about 100 μm—for instance, in the range of a few up to about 100 μm) shown as trench isolation or isle partitioning borders 124. Main cell (or icell) peripheral boundary or edge region 122 has a total peripheral length of 4L; however, the total icell edge boundary length comprising the peripheral dimensions of all the isles comprises cell peripheral boundary 122 (also referred to as cell outer periphery) and trench isolation borders 124. Thus, for an icell comprising N×N isles or mini-cells in a square-shaped isle embodiment, the total icell edge length is N×cell outer periphery. In the representative example of FIG. 8 showing an icell with 4×4=16 isles, N=4, so total cell edge length is 4×cell outer periphery 4L=16L (hence, this icell has a peripheral dimension which is 4 times larger than that of a conventional solar cell). For a square-shaped master cell or icell with dimensions 156 mm×156 mm, square isle side dimensions are approximately 39 mm×39 mm and each isle or sub-cell has an area of 15.21 $cm^2$ per isle.

FIGS. 9A and 9B are representative schematic cross-sectional view diagrams of a backplane-attached solar cell during different stages of solar cell processing. FIG. 9A shows the simplified cross-sectional view of the backplane-attached solar cell after processing steps and before formation of the partitioning trench regions. FIG. 9B shows the simplified cross-sectional view of the backplane-attached solar cell after some processing steps and after formation of the partitioning trench regions to define the trench-partitioned isles. FIG. 9B shows the schematic cross-sectional view of the icell of FIG. 8 along the view axis A of FIG. 8 for an icell pattern (shown for square-shaped isles and square-shaped icell), indicating the uniform-size (equal-size) square-shaped isles for N×N=4×4=16 isles (or sub-cells, mini-cells, tiles).

FIGS. 9A and 9B are schematic cross-sectional diagrams of a monolithic master cell semiconductor substrate on a backplane before formation of trench isolation or partitioning regions, and a monolithic isled or tiled solar cell on a backplane formed from a master cell after formation of trench isolation or partitioning regions, respectively. FIG.

9A comprises semiconductor substrate 130 having width (semiconductor layer thickness) W and attached to backplane 132 (e.g., an electrically insulating continuous backplane layer, for instance, a thin flexible sheet of prepreg). FIG. 9B is a cross-sectional diagram of an isled solar cell (icell)—shown as a cross-sectional diagram along the A axis of the cell of FIG. 8. Shown, FIG. 9B comprises isles or mini-cells $I_{11}$, $I_{21}$, $I_{31}$, and $I_{41}$ each having a trench-partitioned semiconductor layer width (thickness) W and attached to backplane 132. The semiconductor substrate regions of the mini-cells are physically and electrically isolated by an internal peripheral partitioning boundary, trench partitioning borders 124. The semiconductor regions of isles or mini-cells $I_{11}$, $I_{21}$, $I_{31}$, and $I_{41}$ are monolithically formed from the same continuous semiconductor substrate shown in FIG. 9A. The icell of FIG. 9B may be formed from the semiconductor/backplane structure of FIG. 9A by forming internal peripheral partitioning boundaries in the desired mini-cell shapes (e.g., square shaped mini-cells or isles) by trenching through the semiconductor layer to the attached backplane (with the trench-partitioned isles or mini-cells being supported by the continuous backplane). Trench partitioning of the semiconductor substrate to form the isles does not partition the continuous backplane sheet, hence the resulting isles remain supported by and attached to the continuous backplane layer or sheet. Trench partitioning formation process through the initially continuous semiconductor substrate thickness may be performed by, for example, pulsed laser ablation or dicing, mechanical saw dicing, ultrasonic dicing, plasma dicing, water jet dicing, or another suitable process (dicing, cutting, scribing, and trenching may be used interchangeably to refer to the process of trench isolation process to form the plurality of isles or mini-cells or tiles on the continuous backplane). Again, the backplane structure may comprise a combination of a backplane support sheet in conjunction with a patterned metallization structure, with the backplane support sheet providing mechanical support to the semiconductor layer and structural integrity for the resulting icell (either a flexible solar cell using a flexible backplane sheet or a rigid solar cell using a rigid backplane sheet or a semi-flexible solar cell using a semi-flexible backplane sheet). Again, while we may use the term backplane to the combination of the continuous backplane support sheet and patterned metallization structure, more commonly we use the term backplane to refer to the backplane support sheet (for instance, an electrically insulating thin sheet of prepreg) which is attached to the semiconductor substrate backside and supports both the icell semiconductor substrate regions and the overall patterned solar cell metallization structure.

A key advantage of the disclosed monolithically isled solar cells or icells is that they may be monolithically fabricated during cell processing and easily integrated into existing solar cell fabrication process flows. The isled master cell embodiments disclosed herein may be used in conjunction with numerous backplane-attached solar cell designs, processing methods, and semiconductor substrate materials, including the backplane-attached, back-contact solar cells fabricated using epitaxial silicon lift-off process flow described above and outlined in Table 1 and Table 2. A general back-contact solar cell manufacturing process flow may be used to form monolithic isled solar cells or icells—specifically a crystalline-silicon solar cell manufacturing process using relatively thin (in the thickness range of a few microns up to about 100 microns) epitaxial silicon lift-off processing which substantially reduces silicon material usage and eliminates several process steps in the traditional crystalline silicon solar cell manufacturing steps to create low-cost, high-efficiency, back-junction/back-contact crystalline silicon solar cells and modules. Specifically, this process flow shows the fabrication of backplane-attached crystalline silicon solar cells having backplanes attached to the backsides of the solar cells (for instance, prepreg backplane sheets laminated to the backsides of the solar cells) for solar cells and modules with optional allowances for smart cell and smart module design (i.e., allowing for embedded distributed electronics components for enhanced power harvest from the solar cells and modules), formed using a reusable crystalline (either mono-crystalline or multi-crystalline) silicon template and epitaxial silicon deposition on a seed and release layer of porous silicon, which may utilize and integrate the monolithically isled cell (icell) structures and methods disclosed herein.

The following process flow be used to form monolithic isled solar cells or icells. The process starts with a reusable (to be reused at least a few times, in some instances between about 10 up to about 100 times) crystalline silicon template, for example a p-type monocrystalline or multi-crystalline silicon wafer, onto which a thin (a fraction of micron up to several microns) sacrificial layer of porous silicon with controlled porosity is formed (for example by an electrochemical etch process for template surface modification in an HF/IPA or HF/acetic acid wet chemistry in the presence of an electrical current). The porous silicon layer may have at least two layers with a lower porosity surface layer and a higher porosity buried layer. The starting material or reusable crystalline silicon template may be a single crystalline (also known as mono-crystalline) silicon wafer, for example formed using crystal growth methods such as float zone (FZ), czochralski (CZ), magnetic stabilized CZ (MCZ), and may further optionally comprise epitaxial layers grown over such silicon wafers. Alternatively, the starting material or reusable crystalline silicon template may be a multi-crystalline silicon wafer, for example formed using either casting or ribbon, and may further optionally comprise epitaxial layers grown over such silicon wafers. The template semiconductor doping type may be either p or n (often relatively heavy p-type doping to facilitate porous silicon formation), and the wafer shape, while most commonly square shaped, may be any geometric or non-geometric shape such as quasi-square (pseudo square), hexagonal, round, etc.

Upon formation of the sacrificial porous silicon layer, which serves both as a high-quality epitaxial seed layer as well as a subsequent separation/lift-off layer for the resulting epitaxial silicon layer, a thin layer (for example a layer thickness in the range of a few microns up to about 100 microns, and in some instances an epitaxial silicon thickness less than approximately 50 microns) of in-situ-doped (for instance, doped with phosphorus to form a n-type epitaxial silicon layer) crystalline (either mono-crystalline or multi-crystalline) silicon is formed on the sacrificial porous silicon layer, also called epitaxial growth. The in-situ-doped crystalline (either mono-crystalline layer on mono-crystalline template or multi-crystalline layer on multi-crystalline template) silicon layer may be formed, for example, by atmospheric-pressure epitaxy using a chemical-vapor deposition or CVD process in ambient comprising a silicon gas such as trichlorosilane or TCS and hydrogen (and the desired dopant gas such as $PH_3$ for n-type phosphorus doping).

After completion of a portion of solar cell processing steps (including in some instances, backside doped emitter formation, backside passivation, doped base and emitter contact regions for subsequent metallization contacts to the base and emitter regions, and solar cell metallization), a rather inexpensive backplane layer may attached to the thin epi layer for permanent cell support and reinforcement as well as to support formation of the high-conductivity cell metallization structure of the solar cell (for instance, using a two-layer metallization structure using a patterned first layer of metallization or M1 on the solar cell backside prior to the backplane attachment and a patterned second layer of metallization or M2 on the backside of the backplane-attached solar cell after the backplane attachment and after the lift-off release of the backplane-attached solar cell from the reusable template). The continuous backplane material may be made of a thin (for instance, with a thickness in the range of about 50 microns to about 250 microns thick), flexible, and electrically insulating polymeric material sheet such as an inexpensive prepreg material commonly used in printed circuit boards which meets cell process integration and reliability requirements. The partially-processed back-contact, back junction (IBC) backplane-attached solar cell (for instance, with a solar cell area of about 100 mm×100 mm, 125 mm×125 mm, 156 mm×156 mm, 210 mm×210 mm or larger, or solar cell area in the range of about 100 cm$^2$ to 100's of cm$^2$ and even larger) is then separated and lifted off (released) from the reusable template along the mechanically-weakened sacrificial porous silicon layer (for example through a Mechanical Release or MR lift-off process, breaking off the higher porosity porous silicon interface to enable lift-off release) and the template may be conditioned (e.g., cleaned) and re-used multiple times (for instance, between about 10 and 100 times) to reduce the overall solar cell manufacturing cost. The remaining post-lift-off solar cell processing may then be performed on the backplane-attached solar cell, for example first on the solar cell sunny-side (or frontside) which is exposed after being lifted off and released from the template. Solar cell frontside or sunny-side processing may include, for instance, completing frontside texturization (for instance, using an alkaline or acitic texturing), post-texture surface preparation (cleaning), and formation of the frontside passivation and an anti-reflection coating (ARC) using a deposition process. The frontside passivation and ARC layer may be deposited using a Plasma-Enhanced Chemical-Vapor Deposition (PECVD) process and/or another suitable processing method.

The monolithically isled cell (icell) structures and methods disclosed herein may be integrated into device fabrication, such as the exemplary disclosed solar cell fabrication process flow, without substantially altering or adding manufacturing process steps or tools and thus without substantially adding to the cost of manufacturing the solar cell and without substantially altering the main solar cell manufacturing process flow. In fact, the monolithically isled cell (icell) structures and methods disclosed herein can reduce the cost of manufacturing the solar cell, for instance, by reducing the metallization cost (using less metallization material and lower cost metallization process) and/or by improving the solar cell and module manufacturing yield (due to substantial mitigation of solar cell micro-cracks or breakage).

In one embodiment, scribing (also known as trenching or cutting or dicing), of the master cell semiconductor substrate to form the internal isle partitioning trench boundaries and creating the plurality of trench-partitioned isles or mini-cells or sub-cells or tiles may be performed from the frontside or sunnyside (after lift-off release of the backplane-attached epitaxial silicon substrate layer), using a suitable method such as pulsed laser ablation (for instance, pulsed nanoseconds laser scribing) or a mechanical scribing method or a plasma scribing method, through the master cell silicon substrate layer thickness (for example, the epitaxial silicon layer thickness may be in the range of about a few microns up to about 100 µm). Pulsed laser ablation scribing (or another suitable trench scribing method as described before) may be performed such that scribing through the thickness of the semiconductor substrate layer forms relatively narrow (e.g., width of less than 100 microns) trench isolation borders all the way through the entire thickness of the thin silicon layer and essentially stops at/on the backplane (removal and scribing of the continuous backplane material layer being rather small or negligible)-thus monolithically producing fully partitioned monolithic isles (or sub-cells or mini-cells or tiles) supported on a continuous backplane layer. Partitioning trench formation methods to form the plurality of isles and their associated trench partitioning boundaries in a master cell substrate having a thickness in the range of about a few microns to as large as about 200 microns (master cell substrate thickness or width shown as W in FIGS. 9A and 9B) include, for example: pulsed laser scribing (or dicing, or trenching), such as by pulsed nanoseconds laser ablation (using a suitable laser wavelength such as UV, green, IR, etc.); ultrasonic scribing or dicing; mechanical trench formation such as by using a mechanical saw or blade; patterned chemical etching (both wet and plasma etching); screen printing of an etch paste following by etching activation and rinsing of the etch paste residue, or any combination of known or the above mentioned trench formation methods. Pulsed laser ablation processing for trench formation may provide several advantages allowing for the direct patterning of the isle or mini-cell boundaries with relatively high process throughput, enabling formation of relatively narrow trenches (e.g., less than about 100 microns trench width), and without any process consumable (hence, very low process cost). However, irrespective of the trench formation method used to partition the plurality of isles or sub-cells, special care should be taken to reduce or minimize the trench width—for example, it may be desired to make the partitioning trench width less than about 100 microns, in order to make the solar cell area loss due to the icell partitioning trenches a relatively small to negligible fraction of the total icell area (for instance less than about 1% of the total icell area). This will ensure that the loss of icell total-area efficiency due to the partitioning trenches is rather negligible (e.g., less than 1% relative). Pulsed nanoseconds laser ablation processing is capable of high-throughput formation of trenches with trench width well below 100 microns (e.g., about 10 to 60 microns). For example, for a square-shaped icell with the master cell area of 156 mm×156 mm and 4×4=16 isles (or mini-cells) and partitioning trenches with trench width of 50 microns (0.05 mm), for example, formed by pulsed laser ablation trenching, the area fraction R of the total trench planar surface area $A_{trench}$ to the total master cell area (or the icell area $A_{icell}$) can be calculated as follows: $R=A_{trench}/A_{icell}=6\times156$ mm×0.05 mm/(156 mm×156 mm) or R=0.00192. Therefore, this represents an area fraction R of 0.00192 or about 0.2%. This is an extremely small area fraction, ensuring negligible loss of total-area icell efficiency as a result of the partitioning trench areas. In reality, the loss of total-area icell efficiency would be smaller than 0.2% relative under these conditions, since the direct and/or diffused sunlight impinging on the trench isolation or partitioning areas can be at least partially and possibly mostly absorbed on the isle semiconductor edge regions and contribute to the photo-generation process.

The monolithic isled (tiled) solar cell fabrication methods and structures described herein are applicable to various semiconductor (for example including but not limited to crystalline silicon, such as thin epitaxial silicon or thin crystalline silicon wafer) solar cells (for example, front contact or back contact solar cells of various designs with cell semiconductor absorber having a thickness in the range of about a few microns up to about 200 microns), including those formed using epitaxial silicon lift-off processing (as described earlier) or those formed using crystalline silicon wafers, such as mono-crystalline (CZ or MCZ or FZ) wafers or multi-crystalline wafers (cast or ribbon-grown wafers).

For back-contact/back-junction square-shaped cells (for example high-efficiency back-contact/back-junction IBC cells formed using either epitaxial silicon lift-off processing or crystalline silicon wafer cells with backplane reinforcement), the master cell isles (also called tiles, pavers, sub-cells, or mini-cells) may be formed (for example, using pulsed nanoseconds laser scribing of crystalline silicon substrate) as an array of N×N square-shaped isles, N×M rectangular-shaped isles, K triangular-shaped isles, or any geometrically shaped isles or combination thereof on the shared master cell (icell) continuous backplane. In the case of solar cells fabricated using epitaxial lift-off processing, the isle partitioning trench formation process may occur immediately after the lift-off release of the partially-processed backplane-attached master cell and before the remaining processing steps such as frontside surface texturing and post-texture surface cleaning, or immediately after frontside texturing and post-texture surface cleaning and before the process(es) to form the front-surface passivation and anti-reflection coating (ARC) layer(s). Performing the process to form the partitioning or isolation trenches (i.e., trenching process) by pulsed laser scribing or another suitable method (such as one of the other methods described earlier including but not limited to mechanical dicing) before the wet etch texture process (to form the solar cell frontside texture for reduced optical reflection losses) has an added advantage of removing any trenching-process-induced silicon edge damage through wet etching and removal of damaged silicon during the wet texture etch process (which also etches several microns of silicon, including any damaged silicon in the partitioning trench sidewalls, during the texture etch process).

In some solar cell processing embodiments, including those representative process flows described in detail herein, no additional separate fabrication process equipment may be needed for the formation of the monolithically isled master cells (icells). In other words, the formation of trench-partitioned mini-cells or isles within each icell may be integrated fairly easily and seamlessly in solar cell fabrication methods. And in some cases, the monolithic isled solar cell (icell) fabrication process may improve the solar cell fabrication process flow through a reduction of solar cell manufacturing cost, for example, by reducing the cost of solar cell metallization, such as, for instance, by eliminating the need for a copper plating process and associated manufacturing equipment and facilities requirements for copper plating.

Figure 10:
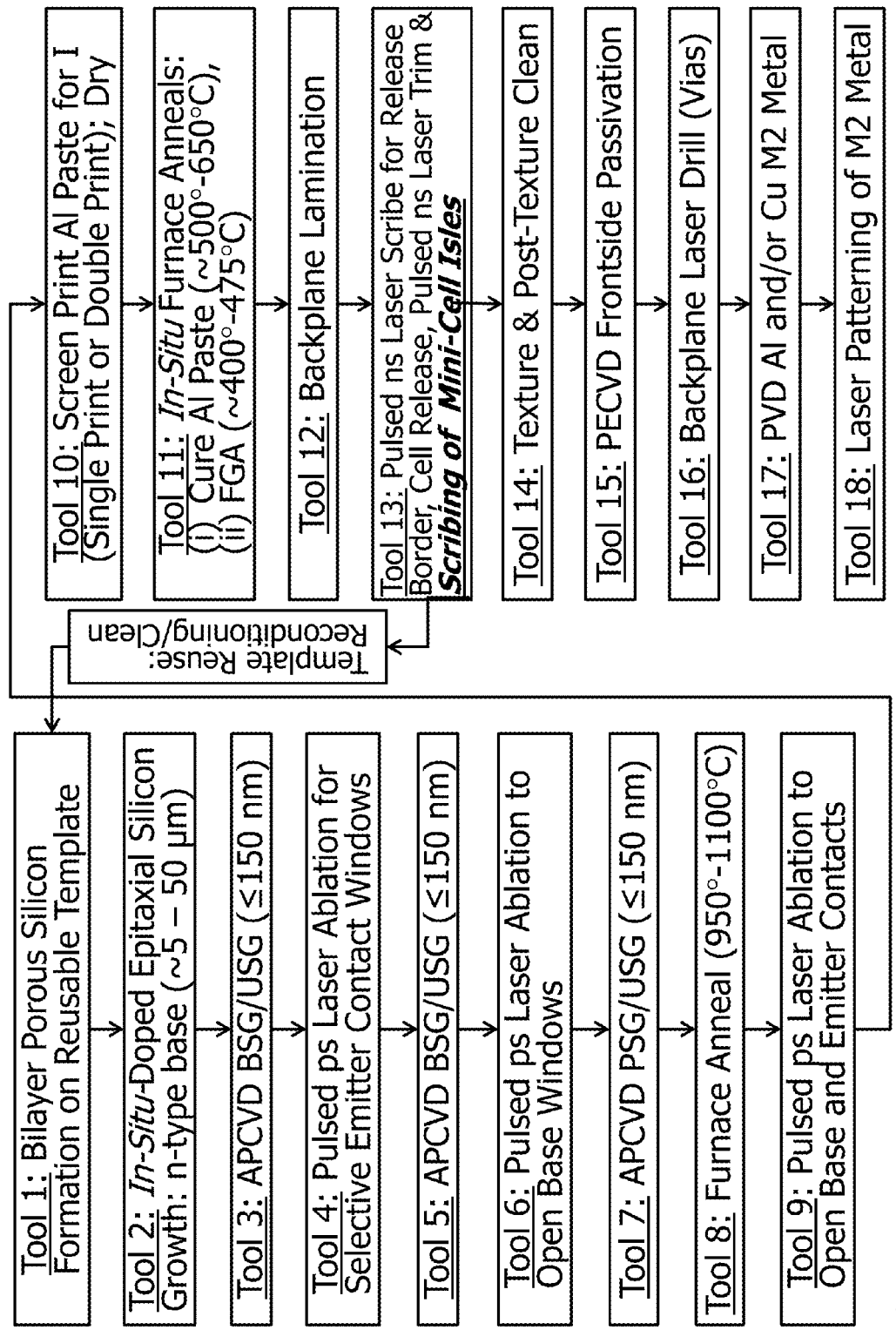
FIG. 10 is a representative backplane-attached icell manufacturing process flow based on epitaxial silicon and porous silicon lift-off processing.

FIG. 10 is a representative backplane-attached icell manufacturing process flow based on epitaxial silicon and porous silicon lift-off processing. This process flow is for fabrication of backplane-attached, back-contact/back junction solar cells (icells) using two patterned layers of solar cell metallization (M1 and M2). This example is shown for a solar cell with selective emitter, i.e., a main patterned field emitter with lighter emitter doping formed using a lighter boron-doped silicate glass (first BSG layer with smaller boron doping deposited by Tool 3), and more heavily-boron-doped emitter contact regions using a more heavily boron-doped silicate glass (second BSG layer with larger boron doping deposited by Tool 5). While this example is shown for an IBC solar cell using a double-BSG selective emitter process, the icell designs are applicable to a wide range of other solar cell structures and process flows, including but not limited to the IBC solar cells without selective emitter (i.e., same emitter boron doping in the field emitter and emitter contact regions). This example is shown for an IBC icell with an n-type base and p-type emitter. However, the polarities can be changed so that the solar cell has p-type base and n-type emitter instead.

FIG. 10 is a representative manufacturing process flow embodiment for the fabrication of back-contact back junction crystalline monolithic isled silicon solar cells (icells). Specifically, FIG. 10 provides for the formation of an epitaxial (epi) solar cell, optionally with a monolithically integrated bypass switch (MIBS) pn junction diode, and having a double borosilicate glass (BSG) selective emitter. As shown in this flow, mini-cell trench isolation regions are formed at Tool 13, after cell release border scribe and cell lift-off release and before texturization of the exposed released side (also known as frontside or sunnyside of the resulting icell). Alternatively, the mini-cell trench isolation regions may be formed after texture and post texture clean in Tool 14, and before frontside passivation (shown as PECVD). Performing the pulsed laser scribing before wet etch texture (texture and post texture clean using Tool 14) may have an added advantage of removing any laser-induced scribed silicon edge damage through wet etching and removal of damaged silicon.

A representative process flow for forming a monolithic isled (tiled) back-contact/back-junction (IBC) solar cell using epitaxial silicon lift-off processing may comprise the following fabrication steps: 1) start with reusable crystalline (mono-crystalline or multi-crystalline) silicon template; 2) form porous silicon on template (for example, bilayer porous silicon with a lower porosity surface layer and a higher porosity buried layer using anodic etch in HF/IPA or HF/acetic acid); 3) deposit epitaxial silicon with in-situ doping (for instance, n-type phosphorus doped epitaxial silicon); 4) perform back-contact/back-junction cell processing while the epitaxial silicon substrate resides on its template, including formation of patterned field emitter junction, backside passivation, doped base and emitter contact regions for subsequent metallized solar cell ohmic contacts, and formation of a first metallization layer (also known as M1)—alternatively an example of a back-contact/back-junction (IBC) solar cell fabrication process flow may comprise a selective emitter process (with more lightly doped field emitter and more heavily doped emitter contact regions) using double-BSG (BSG is boron-doped silicate glass or boron doped silicon oxide layer formed, for instance, by an atmospheric-pressure chemical-vapor deposition or APCVD process) process flow for selective emitter formation (other methods of selective emitter formation may be used instead of double BSG process, for instance, using screen printed dopant pastes); 5) attach or laminate backplane layer or sheet on back-contact cell backside; 6) laser scribe release border (lift off release boundary) around the backplane boundary at least partially into epitaxial silicon layer thickness and then release by a lift-off process (e.g., mechanical release lift-off to separate the backplane-attached epitaxial silicon substrate from the reusable template by breaking off the mechanically weakened higher porosity porous silicon layer); 7) perform the trenching (also called scribing or cutting or dicing) process using pulsed nanoseconds laser ablation (or one of the other suitable trench isolation formation methods as described earlier) from the solar cell sunnyside (opposite the backplane side) to monolithically partition the silicon substrate into the plurality of mini-cells or isles—for instance, into an array of isles comprising 4×4=16 mini-cells (also optionally trim the master cell peripheral boundary, for instance, using pulsed laser cutting, to establish the precise master cell or icell dimensions with well-defined smooth cell boundary edges); 8) proceed with performing the remaining back-end fabrication processes such as: wet silicon etch/texture in alkaline and/or acidic chemistry (this process performs the texturization on the frontside while the chemically-resistant backplane protects the backside of the solar cell from the texturization chemistry), post-texture surface preparation including wet cleaning (this process performs the frontside surface cleaning while the chemically-resistant backplane protects the backside of the solar cell from the wet cleaning chemistry), deposition of the frontside surface passivation and antireflection coating (ARC) layer(s), for instance, by Plasma-Enhanced Chemical-Vapor Deposition (PECVD) or a combination of PECVD for ARC deposition (e.g., hydrogenated silicon nitride) with another process such as Atomic Layer Deposition (ALD) for passivation layer deposition (such as a thin sub-30 nm layer of aluminum oxide, amorphous silicon, or amorphous silicon oxide directly on the cleaned, textured silicon surface and underneath the silicon nitride ARC layer—if using a multi-layer frontside passivation/ARC structure, such as a two-layer structure of one of the above-mentioned passivation layers covered by the silicon nitride ARC layer, the entire stack may also be deposited using PECVD using a vacuum-integrated process). The frontside passivation and ARC layer deposition will not only cover the frontside surfaces of the mini-cells or isles, it will also cover the sidewalls of the trench-partitioned isles or mini-cells, hence, substantially improving the passivation and ARC properties of the icell by improving the passivation and light capturing properties of the trench sidewalls as well as the top surfaces of the isles. After completion of the frontside texture/cleaning/passivation and ARC deposition processes, the remaining solar cell fabrication process step involves completion of the second metallization layer (M2) on the backplane-attached solar cell backside. In order to accomplish this task, a plurality of via holes are drilled according to a pre-designed via hole pattern, for instance using laser drilling, into the thin (e.g., 25 microns up to 250 microns backplane thickness), electrically insulating, continuous backplane layer (e.g., a 25 micron to 100 micron thick laminated prepreg sheet). The number of via holes on a solar cell (e.g., 156 mm×156 mm icell) backplane may be on the order of 100's to 1000's. The via holes may have average diagonal hole dimension (e.g., average diameter of each via hole) in the range of 10's of microns to 100's of microns (for instance, about 100 microns to 300 microns). The laser-drilled via holes through the electrically insulating backplane layer are positioned to land on the interdigitated base and emitter metallization fingers (formed by the first level of patterned metallization by screen printing of a metallic paste or by physical-vapor deposition and patterning of a metal layer such as a metal comprising aluminum or aluminum-silicon alloy). These via holes will serve as the interconnection channels or plugs between the first layer of patterned metallization or M1 formed directly on the solar cell backside prior to the backplane attachment/lamination and the second layer of patterned metal or M2 to be formed immediately after formation of the laser-drilled via holes. In some instances for the icells disclosed herein, the second level of patterned metallization M2 may be formed by one of several methods, including but not limited to one or a combination of: (1) Physical-Vapor Deposition or PVD (thermal evaporation and/or electron-beam evaporation and/or plasma sputtering) of an inexpensive high-conductivity metal comprising, for instance, aluminum and/or copper (other metals may also be used) followed by pulsed laser ablation patterning, (2) Physical-Vapor Deposition or PVD (thermal evaporation and/or electron-beam evaporation and/or plasma sputtering) of an inexpensive high-conductivity metal comprising, for instance, aluminum and/or copper (other metals may also be used) followed by metal etch patterning (e.g. screen printing of an etch paste or screen printing of a resist followed by a metal wet etch process and subsequent removal of the resist), (3) Screen printing or stencil printing of a suitable metal paste (such as a paste comprising copper and/or aluminum), (4) Inkjet printing or aerosol printing of a suitable metal paste (such as a paste comprising copper and/or aluminum), (5) Patterned plating of a suitable metal, for instance, copper plating. The patterned second layer of metallization (M2) may also comprise a thin capping layer (for instance, a thin <1 micron capping layer of NiV or Ni formed by plasma sputtering or screen printing or plating) to protect the main patterned M2 (e.g., aluminum and/or copper containing high conductivity metal) and to provide a suitable surface for soldering or conductive adhesive as needed. The back-contact/back junction (IBC) solar cells described herein may utilize two layers of patterned metallization (M1 and M2), with the first patterned metallization layer M1 forming the interdigitated base and emitter metallization fingers on each mini-cell or isle according to a fine-pitch pattern (for instance, base-emitter M1 finger pitch in the range of about 200 microns to 2 mm, and in some cases in the range of about 500 microns to about 1 mm), and the second patterned layer of metallization M2 forming the final icell metallization and interconnecting the isles/sub-cells/or mini-cells according to a pre-specified current and voltage scaling factor. Patterned M2 may be patterned substantially orthogonal or perpendicular to patterned M1 and have a much larger finger-to-finger pitch than patterned M1 fingers. This will substantially facilitate fabrication of patterned M2 according to a low-cost, high-yield manufacturing process. Patterned M2 not only formed the final icell patterned metallization, it also forms the electrically conductive via plugs through the laser-drilled via holes in order to complete the M2-to-M1 interconnections based on desired icell metallization structure.

It is also possible to extend the icell concept so that the second layer of patterned metallization M2 can be used to not only complete the individual master cell (or icell) through sub-cell electrical interconnections, but also monolithically interconnect a plurality of icells sharing the same continuous backplane layer, hence, resulting in a Monolithic Module structure facilitated and enabled by the icells embodiments and with numerous additional benefits. The above epitaxial silicon lift off icell process flows shows the process flow for fabricating monolithic icells with each icell being attached to its own separate pre-cut continuous backplane layer, and each individual backplane attached icell being processed through the entire backend process flow after its backplane lamination. The icells processed using this approach will then be tested and sorted at the end of the process and can be assembled into the PV modules by interconnections of the icells to one another, for instance in electrical series, using tabbing and/or stringing of the cells (also involving soldering and/or conductive adhesives to interconnect the plurality of solar cells to one another as part of PV module assembly), and then completion of the module lamination and final module assembly and testing. An alternative embodiment of an icell implementation resulting in a novel monolithic module structure involves attachment or lamination of a plurality of relatively closely-spaced icells (for instance, with the adjacent icell to icell spacing in the range of 50 microns up to about 2 mm, and often in the range of about 100 microns to 1 mm) on their backsides to a larger continuous backplane sheet at the Backplane Lamination (or attachment step) performed by Tool 12 in FIG. 10. The remaining process steps after Tool 12 are performed concurrently on the plurality of icells sharing a common continuous backplane layer on their backsides (instead of being performed on the individual separate icells, each with their own separate backplane). After completion of the final metallization (patterned second layer of metal M2), the monolithic patterned M2 not only completes the metallization pattern for each icell among the plurality of the icells sharing the larger continuous backplane layer, it also completes electrical interconnections of the plurality of icells to one another according to any desired arrangement, for instance, interconnecting the icells to one another all in series or in a hybrid parallel/series arrangement. This embodiment enables fabrication of icells and the monolithic electrical interconnections among a plurality of icells on a shared continuous backplane layer, hence eliminating the need for subsequent soldering/tabbing/stringing of the icells to one another during the final module assembly. For example, in order to make 6×10=60-cell modules, an array of 6×10=60 icells are attached/laminated on their backsides immediately after completion of the patterned first layer of metal (M1)—after Tool 11 process in FIG. 10—to a properly sized continuous backplane sheet (e.g., a sheet of prepreg) and the remaining process steps (starting with the backplane lamination/attachment process shown as Tool 12 and through the remaining backend process steps through completion of the second layer of patterned metal M2) are all performed on the large backplane-attached sheet comprising the plurality of (e.g., 6×10=60) icells. In this monolithic module example which comprises 6×10=60 icells, if each icell has dimensions of about 156 mm×156 mm and the spacing between the adjacent icells is about 1 mm, the continuous backplane layer or sheet (e.g., an aramid fiber/resin prepreg sheet with a thickness in the range of about 50 to 100 microns) to be used for attachment/lamination to the backsides of the 6×10 array of icells should have minimum dimensions of about 942 mm×1570 mm (e.g., the sheet may be made somewhat oversized to allow for backplane extensions in the side margins of the monolithic module, for instance, about 1 m×1.6 m backplane sheet dimensions in this 6×10=60 icell monolithic module example). As another example, in order to make 6×12=72-cell modules, an array of 6×12=72 icells are attached/laminated on their backsides immediately after completion of the patterned first layer of metal (M1)—after Tool 11 process in FIG. 10—to a properly sized continuous backplane sheet (e.g., a sheet of prepreg) and the remaining process steps (starting with the backplane lamination/attachment process shown as Tool 12 and through the remaining backend process steps through completion of the second layer of patterned metal M2) are all performed on the large backplane-attached sheet comprising the plurality of (e.g., 6×12=72) icells. In this monolithic module example which comprises 6×12=72 icells, if each icell has dimensions of about 156 mm×156 mm and the spacing between the adjacent icells is about 1 mm, the continuous backplane layer or sheet (e.g., an aramid fiber/resin prepreg sheet with a thickness in the range of about 50 to 100 microns) to be used for attachment/lamination to the backsides of the 6×12 array of icells should have minimum dimensions of about 942 mm×1884 mm (e.g., the sheet may be made somewhat oversized to allow for backplane extensions in the side margins of the monolithic module, for instance, approximately 1 m×1.9 m backplane sheet dimensions in this 6×12=72 icell monolithic module example). The monolithic interconnections of the plurality of icells on a shared continuous backplane layer using the second layer of patterned metal M2 results in further reduction of the overall solar cell and PV module manufacturing cost as well as improved projected reliability of the PV modules during field operation (due to the elimination of soldered tabs, strings).

Aspects of the solar cells disclosed herein can be applied to solar cells using this type of process flow as outlined in the representative process flow of FIG. 10, as well as many other solar cell designs (as described before) and solar cell fabrication process flows including but not limited to the solar cells fabricated from starting monocrystalline wafers (e.g., Czochralski or CZ, Float Zone or FZ) or multi-crystalline wafers (from cast crystalline bricks or formed by a ribbon pulling process) or epitaxial growth or other substrate fabrication methods. Moreover, icell embodiments may be applied to other semiconductor materials besides silicon as described before, including but not limited to gallium arsenide, germanium, gallium nitride, other compound semiconductors, or a combination thereof.

Figure 11:
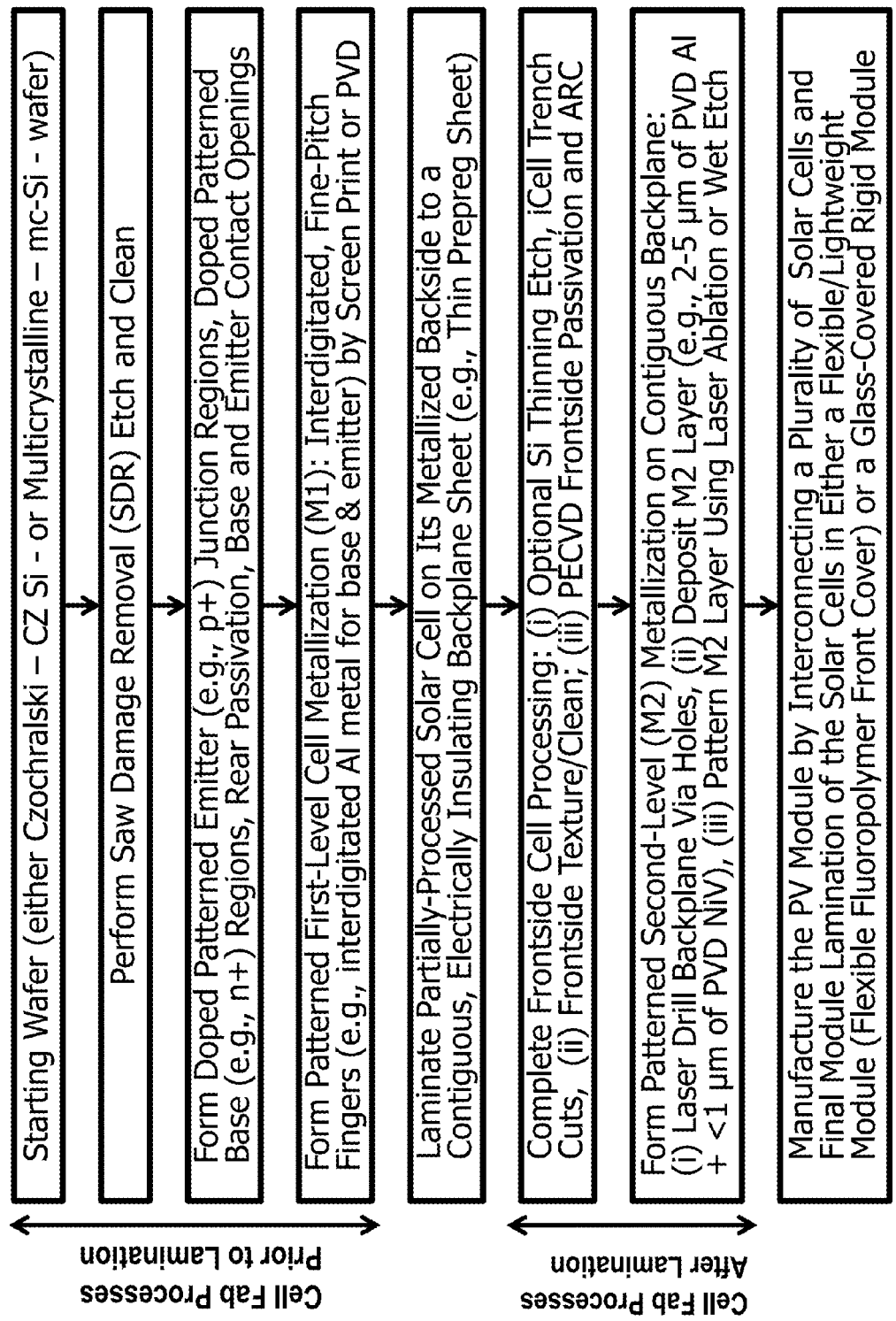
FIG. 11 is a high level solar cell and module fabrication process flow embodiment using starting crystalline (monocrystalline or multi-crystalline) silicon wafers.

FIG. 11 is a high level solar cell and module fabrication process flow embodiment using starting crystalline (monocrystalline or multi-crystalline) silicon wafers. FIG. 11 shows a high-level icell process flow for fabrication of backplane-attached back-contact/back-junction (IBC) icells using two layers of metallization: M1 and M2. The first layer or level of patterned cell metallization M1 is formed as essentially the last process step among a plurality of front-end cell fab processes prior to the backplane lamination to the partially processed icell (or a larger continuous backplane attached to a plurality of partially processed icells when fabricating monolithic modules as described earlier). The front-end cell fab processes outlined in the top 4 boxes of FIG. 11 essentially complete the back-contact/back-junction solar cell backside structure through the patterned M1 layer. Patterned M1 is designed to conform to the icell isles (mini-cells) and comprises a fine-pitch interdigitated metallization pattern as described for the epitaxial silicon icell process flow outlined in FIG. 10. In FIG. 11, the fifth box from the top involves attachment or lamination of the backplane layer or sheet to the partially processed icell backside (or to the backsides of a plurality of partially processed icells when making a monolithic module)—this process step is essentially equivalent to the one performed by Tool 12 in FIG. 10 in case of epitaxial silicon lift-off process). In FIG. 11, the sixth and seventh boxes from the top outline the back-end or post-backplane-attachment (also called post-lamination) cell fab processes to complete the remaining frontside (optional silicon wafer thinning etch to form thinner silicon absorber layer if desired, partitioning trenches, texturization, post-texturization cleaning, passivation and ARC) as well as the via holes and second level or layer of patterned metallization M2. The "post-lamination" processes (or the back-end cell fab processes performed after the backplane attachment) outlined in the sixth and seventh boxes of FIG. 11 essentially correspond to the processes performed by Tools 13 through 18 for the epitaxial silicon lift off process flow shown in FIG. 10. The bottom box in FIG. 11 describes the final assembly of the resulting icells into either flexible, lightweight PV modules or into rigid glass-covered PV modules. If the process flow results in a monolithic module comprising a plurality of icells monolithically interconnected together by the patterned M2 (as described earlier for the epitaxial silicon lift off process flow), the remaining PV module fabrication process outlined in the bottom box of FIG. 11 would be simplified since the plurality of the interconnected icells sharing a larger continuous backplane and the patterned M2 metallization for cell-to-cell interconnections are already electrically interconnected and there is no need for tabbing and/or stringing and/or soldering of the solar cells to one another. The resulting monolithic module can be laminated into either a flexible, lightweight PV module (for instance, using a thin flexible fluoropolymer cover sheet such as ETFE or PFE on the frontside instead of rigid/heavy glass cover sheet) or a rigid, glass-covered PV module.

The design of isles or mini-cells (sub-cells) of an icell may include various geometrical shapes such as squares, triangles, rectangles, trapezoids, polygons, honeycomb hexagonal isles, or many other possible shapes and sizes. The shapes and sizes of isles, as well as the number of isles in an icell may be selected to provide optimal attributes for one or a combination of the following considerations: (i) overall crack elimination or mitigation in the master cell (icell); (ii) enhanced pliability and flexibility/bendability of master cell (icell) without crack generation and/or propagation and without loss of solar cell or module performance (power conversion efficiency); (iii) reduced metallization thickness and conductivity requirements (and hence, reduced metallization material consumption and processing cost) by reducing the master cell (icell) current and increasing the icell voltage (through series connection or a hybrid parallel-series connection of the isles in the monolithic icell, resulting in scaling up the voltage and scaling down the current); and (iv) providing relatively optimum combination of electrical voltage and current ranges in the resulting icell to facilitate and enable implementation of inexpensive distributed embedded electronics components on the icells and/or within the laminated PV modules comprising icells, including but not limited to at least one bypass switch (e.g., rectifying pn junction diode or Schottkty barrier diode) per icell, maximum-power-point tracking (MPPT) power optimizers (at least a plurality of MPPT power optimizers embedded in each module, with each MPPT power optimizer dedicated to at least 1 to a plurality of series-connected and/or parallel-connected icells), PV module power switching (with remote control on the power line in the installed PV array in order to switch the PV modules on or off as desired), module status (e.g., power delivery and temperature) during operation of the PV module in the field, etc. For example and as described earlier, in some applications and instances when considered along with other requirements, it may be desired to have smaller (for example triangular shaped) isles near the periphery of the master cell (icell) to reduce crack propagation and/or to improve flexibility/bendability of the resulting icells and flexible, lightweight PV modules.

Partitioning the main/master cell into an array of isles or sub-cells (such as an array of N×N square or pseudo-square shaped or K triangular-shaped or a combination thereof) and interconnecting those isles in electrical series or a hybrid combination of electrical parallel and electrical series reduces the overall master cell current for each isle or mini-cell—for example by a factor of N×N=$N^2$ if all the square-shaped isles are connected in electrical series, or by a factor of K if all the triangular-shaped isles are connected in series. And while the main/master cell or icell has a maximum-power (mp) current of $I_{mp}$, and a maximum-power voltage of $V_{mp}$, each series-connected isle (or subgroups of isles connected in parallel and then in series) will have a maximum-power current of $I_{mp}/N^2$ (assuming $N^2$ isles connected in series) and a maximum-power voltage of $V_{mp}$ (no change in voltage for the isle). Designing the first and second metallization layer patterns, M1 and M2 respectively, such that the isles on a shared continuous or continuous backplane are connected in electrical series results in a main/master cell or icell with a maximum-power current of $I_{mp}/N^2$ and a maximum power voltage of $N^2 \times V_{mp}$ or a cell (icell) maximum power of $P_{mp}=I_{mp} \times V_{mp}$ (the same maximum power as a master cell without mini-cell partitioning).

Thus, a monolithically isled master cell or icell architecture reduces ohmic losses due to reduced solar cell current and allows for thinner solar cell metallization structure generally and a much thinner M2 layer if applicable or desired. Further, reduced current and increased voltage of the master cell or icell allows for relatively inexpensive, high-efficiency, maximum-power-point-tracking (MPPT) power optimizer electronics to be directly embedded into the PV module and/or integrated on the solar cell backplane.

Assume a main/master cell or icell with S square-shaped or pseudo-square shaped pattern of isles (where S is an integer and assume S=N×N) or P triangular isles (where P is an integer, for example 2 or 4) with each adjacent set of P trench-isolated triangular isles forming a square-shaped subgroup of isles. Each adjacent set of P triangular isles forming a square-shaped sub-group may be connected in electrical parallel and the set of S sub-groups are connected in electrical series. The resulting main cell will have a maximum-power current of $I_{mp}/S$ and a maximum power voltage of $S \times V_{mp}$. In practice, the reduced current and increased voltage of the isles may also allow for a relatively inexpensive, high-efficiency, maximum-power-point-tracking (MPPT) power optimizer electronics to be directly embedded into the PV module and/or integrated on the solar cell backplane. Moreover, the innovative aspects of an icell also enable distributed shade management based on implementation of inexpensive bypass diodes (e.g. pn junction diodes or Schottky diodes) into the module, for instance, one bypass diode embedded with each solar cell prior to the final PV module lamination. In a metallization embodiment, the M1 metallization layer may be a busbarless, fine-pitch (base-to-base pitch in the range of approximately about 200 µm to 2 mm, and more specifically in the range of about 500 µm to 1,500 µm) interdigitated Al and/or Al/Si metal finger pattern (formed by screen printing or PVD and post-PVD patterning) contained within each isle. For each isle, the M1 fingers may be slightly recessed from the partitioning trench isolation edges (for example recessed or offset from the isle trench isolation edges by approximately 50 µm to 100's µm). In other words, the M1 fingers for each isle in the master cell are electrically isolated and physically separated from each other (the M1 pattern corresponding to a particular isle may be referred to herein as an M1 unit cell).

The electrical interconnection configuration of the isles (all series, hybrid parallel-series, or all parallel) may be defined by the M2 pattern design wherein M1 serves as an on-cell contact metallization for all of the master cell isles and M2 provides high-conductivity metallization and electrical interconnection of the isles within the icell or master cell.

Moreover, the enhanced-voltage/reduced-current main/master solar cell or icell provides for the integration of a relatively inexpensive, high-performance, high-efficiency maximum-power-point-tracking (MPPT) power optimizer electronics embedded within each module and associated with each icell and/or each isle, —thus providing enhanced power and energy harvest capability across a master cell having shaded, partially shaded, and unshaded isles. Similarly, each icell or even each isle within each icell may have its own inexpensive bypass diode (pn junction diode or Schottky barrier diode) in order to provide distributed shade management capability for enhanced solar cell protection and power harvest under shading and partial shading conditions. An all-parallel electrical connection of isles provided by an all-parallel M2 pattern, as compared to all-series or hybrid parallel-series connection, also provides some of the numerous advantages of a monolithically isled solar cell as described above, particularly the increased flexibility and bendability of the resulting icells and PV modules.

Figure 12:
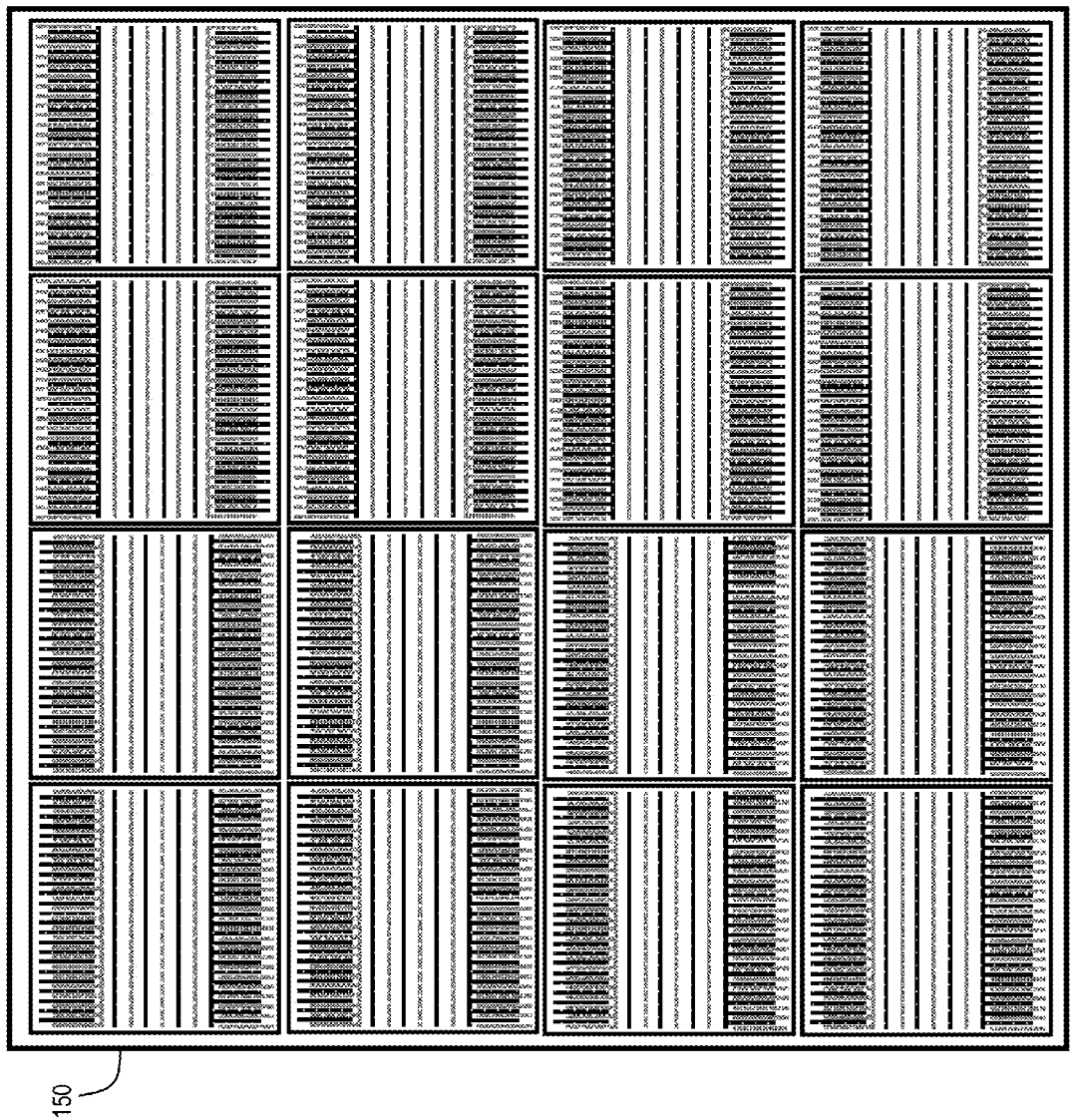
FIG. 12 is a drawing of backside M1 metallization on icell 150 having a 4×4 array of sub-cells.
Figure 13:
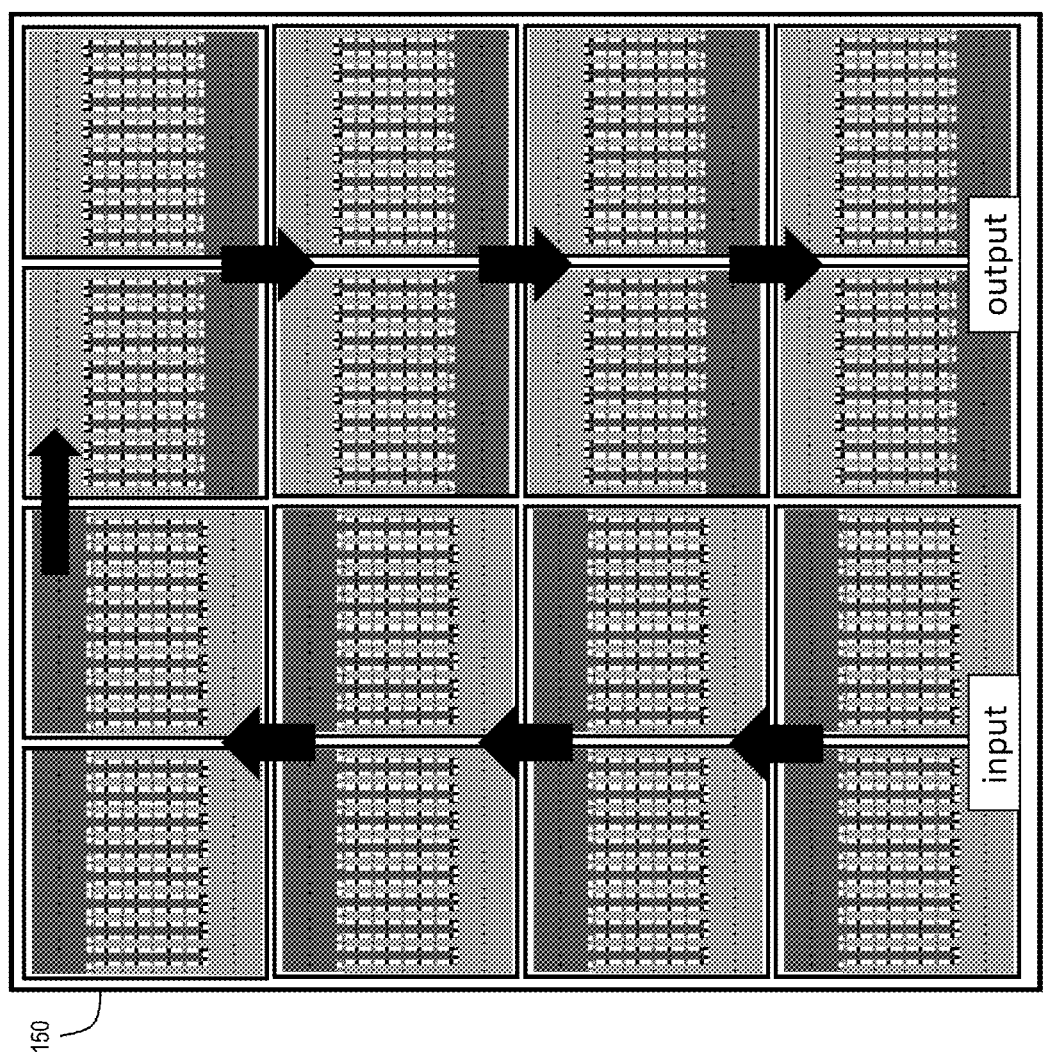
FIG. 13 is a drawing of backside M2 metallization on icell 150 having a 4×4 array of sub-cells.
Figure 14:
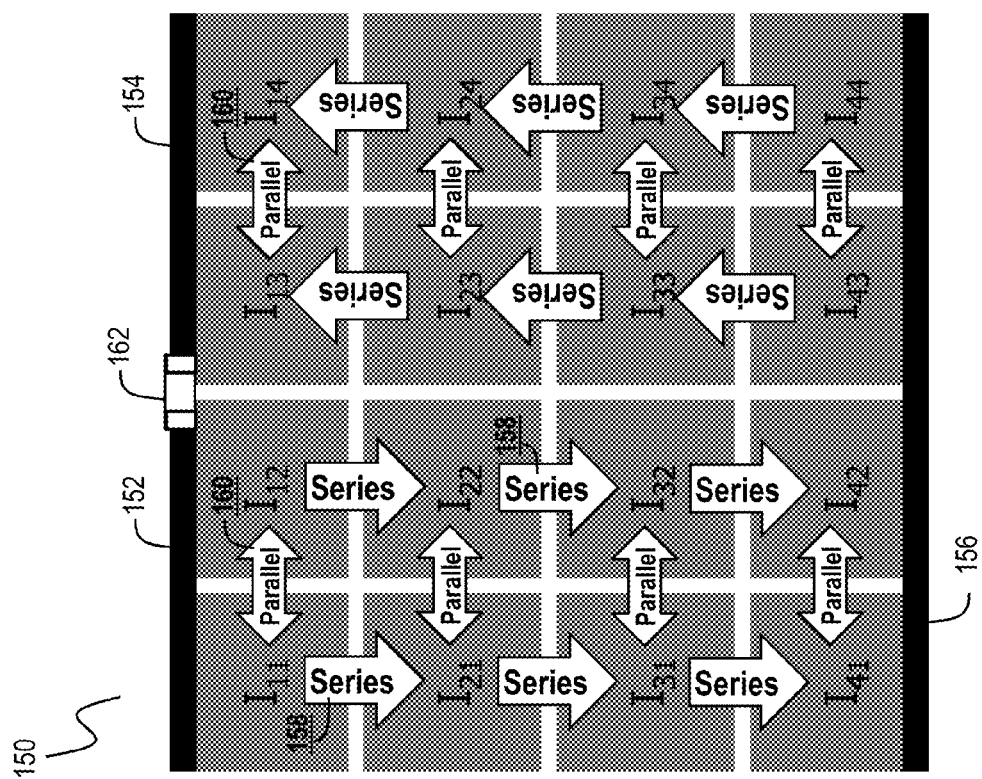
FIG. 14 shows the sub-cell interconnections of a 2×8 hybrid parallel design on icell 150 as shown by the M1 and M2 metallization patterns depicted in FIGS. 12 and 13, respectively.

FIG. 12 is a drawing of backside M1 metallization on icell 150 having a 4×4 array of sub-cells (such as that shown in FIG. 8). The M1 layer shown is consistent with that described in FIG. 1A and formed on each sub-cells $I_{11}$ through $I_{44}$ for sub-cell interconnection (e.g., at the M2 metallization level) for a 2×8 hybrid parallel sub-cell interconnection design. As noted, numerous sub-cell interconnection patterns are possible. FIG. 13 is a drawing of backside M2 metallization on icell 150 having a 4×4 array of sub-cells (as shown in FIG. 12) and highlighting series current flow consistent with a 2×8 hybrid parallel sub-cell interconnection design. The M2 layer shown is consistent with that described in FIG. 1B and formed on each sub-cells $I_{11}$ through $I_{44}$ in a 2×8 hybrid parallel sub-cell interconnection design. FIG. 14 shows the sub-cell interconnections of a 2×8 hybrid parallel design on icell 150 as shown by the M1 and M2 metallization patterns depicted in the icells of FIGS. 12 and 13, respectively. In the icell embodiment of FIG. 13, each sub-cell may be individually tested at its sub-cell M2 busbar. Importantly and as noted previously, sub-cell interconnection may be formed as part of the M2 metallization layer itself or connected via tabbing (sub-cell interconnection leads). As shown in FIG. 14, hybrid parallel-series sub-cell interconnection configuration (2×8HPS) of icell 150 has a 4×4 array of electrical series and parallel connected isles $I_{11}$ through $I_{44}$ from emitter busbar 152 to base busbar 154, adjacent isles in a column connected in parallel by M2 parallel connections 160 and each isle in a column electrically connected by M2 series connections 158 and combined parallel connected adjacent isles electrically connected in series by lateral M2 jumpers 156. Bypass switch 162 is positioned between and directly connected to emitter busbar 152 and base busbar 154.

The disclosed systems and methods provide efficient back contact solar cells and metallization structures. The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:
1. An interdigitated back contact solar cell comprising:
a single solar cell substrate having a light receiving frontside and a backside, said backside comprising base and emitter regions;
a first level metal (M1) disposed on said substrate backside contacting said base and emitter regions, M1 comprising:
a first interdigitated metallization of base and emitter fingers,
a second interdigitated metallization of metallization of base and emitter fingers,
and a third interdigitated metallization of metallization of base and emitter fingers,
the second interdigitated metallization and third interdigitated metallization each being perpendicular to the first interdigitated metallization,
the second interdigitated metallization and third interdigitated metallization each being parallel to each other;
a second level metal (M2) disposed above on M1, M2 comprising:
a fourth interdigitated metallization of base and emitter fingers,
a base bus bar,
and an emitter busbar,
the base busbar and emitter busbar being parallel to each other,
the base busbar and emitter busbar each being perpendicular to the M2 interdigitated metallization;
wherein the fourth interdigitated metallization of M2 is directly above the first interdigitated metallization of M1, and perpendicular to the first interdigitated metallization of M1,
wherein the base busbar of M2 is directly above the second interdigitated metallization of M1, is perpendicular to the second interdigitated metallization of M1, and parallel to the first interdigitated metallization of M1,
wherein the emitter busbar of M2 is directly above the third interdigitated metallization of M1, is perpendicular to the second interdigitated metallization of M1, and parallel to the first interdigitated metallization of M1.
2. The interdigitated back contact solar cell of claim 1, wherein said second level metal is recessed with respect to the periphery of the solar cell.
3. The interdigitated back contact solar cell of claim 1, wherein said second interdigitated metallization is patterned with uniformly linear and parallel interdigitated base and emitter metallization.
4. The interdigitated back contact solar cell of claim 1, wherein said second interdigitated metallization is patterned with parallel interdigitated base and emitter metallization having fingers extending orthogonally therefrom.
5. The interdigitated back contact solar cell of claim 1, wherein said single solar cell substrate further comprises a plurality of trench isolated sub-cells, each of said sub-cells comprising:
a first level metal (M1) on said substrate backside contacting said base and emitter regions, M1 comprising:
a first interdigitated metallization of base and emitter fingers,
a second interdigitated metallization of metallization of base and emitter fingers,
and a third interdigitated metallization of metallization of base and emitter fingers,
the second metallization and third interdigitated metallization each being perpendicular to the first interdigitated metallization,
the second metallization and third interdigitated metallization each being parallel to each other;

a second level metal (M2) disposed above of M1, in plan view of the solar cell substrate backside, M2 comprising:
a fourth interdigitated metallization of base and emitter fingers,
a base busbar,
and an emitter busbar,
the base busbar and emitter busbar being parallel to each other,
the base busbar and emitter busbar each being perpendicular to the M2 interdigitated metallization;
wherein the fourth interdigitated metallization of M2 is directly above the first interdigitated metallization of M1, in plan view of the solar cell substrate backside, and perpendicular to the first interdigitated metallization of M1,
wherein the base busbar of M2 is directly above the second interdigitated metallization of M1, in plan view of the solar cell substrate backside, and is perpendicular to the second interdigitated metallization of M1, and parallel to the first interdigitated metallization of M1,
wherein the emitter busbar of M2 is directly above the third interdigitated metallization of M1, in plan view of the solar cell substrate backside, and is perpendicular to the second interdigitated metallization of M1, and parallel to the first interdigitated metallization of M1.

6. The interdigitated back contact solar cell of claim 1, further comprising an insulating backplane between said first level metal (M1) and said second level metal (M2).

7. The interdigitated back contact solar cell of claim 6, wherein said insulating backplane is a thin prepreg sheet.

* * * * *